(12) United States Patent
He et al.

(10) Patent No.: US 12,369,436 B2
(45) Date of Patent: Jul. 22, 2025

(54) TRICHROME PIXEL LAYOUT

(71) Applicant: GOOGLE LLC, Mountain View, CA (US)

(72) Inventors: Gang He, Cupertino, CA (US); Aurelien Jean Francois David, San Francisco, CA (US)

(73) Assignee: GOOGLE LLC, Mountain View, CA (US)

( * ) Notice: Subject to any disclaimer, the term of this patent is extended or adjusted under 35 U.S.C. 154(b) by 228 days.

(21) Appl. No.: 18/166,324

(22) Filed: Feb. 8, 2023

(65) Prior Publication Data

US 2023/0282773 A1 Sep. 7, 2023

Related U.S. Application Data

(63) Continuation of application No. PCT/US2023/060709, filed on Jan. 16, 2023.
(Continued)

(51) Int. Cl.
*H10H 20/825* (2025.01)
*H10H 20/01* (2025.01)
(Continued)

(52) U.S. Cl.
CPC ...... *H10H 20/825* (2025.01); *H10H 20/0137* (2025.01); *H10H 20/812* (2025.01); *H10H 29/142* (2025.01)

(58) Field of Classification Search
CPC ............ H10H 20/825; H10H 20/0137; H10H 20/812; H10H 29/142; H01L 25/0753
(Continued)

(56) References Cited

U.S. PATENT DOCUMENTS 10,957,818 B2  3/2021  Ahmed
11,545,527 B2  1/2023  Liu et al.
(Continued)

FOREIGN PATENT DOCUMENTS

CN  110137209 A  8/2019
CN  112103315 A  12/2020
(Continued)

OTHER PUBLICATIONS

Invitation to Pay Additional Fees for PCT Application No. PCT/US2023/060709, mailed on Apr. 17, 2023, 12 pages, Including partial search report.
(Continued)

*Primary Examiner* — Caleen O Sullivan
(74) *Attorney, Agent, or Firm* — Brake Hughes Bellermann LLP

(57) ABSTRACT

Methods and devices are presented for transforming a layout of a densely packed grid of micro-LED light emitters to a layout of a square rectilinear pixel grid to achieve compatibility with hardware and software used in imaging and display technologies. In particular, a pattern of regular hexagonal emitter cells for fabrication on a III-nitride substrate can be transformed to a square pixel array of irregular hexagonal trichrome pixels that are readily addressable. Separation between adjacent trichrome pixels, and between their constituent emitters, can be established for overlay tolerance, while maintaining a cell packing density of about 70% and a pixel pitch of about 4.0 μm. Wavelength and quantum efficiency properties are shown to depend on optical current density, which can be determined by the emitter area specified in the grid layout.

24 Claims, 18 Drawing Sheets

Related U.S. Application Data

(60) Provisional application No. 63/299,702, filed on Jan. 14, 2022.

(51) Int. Cl.
*H10H 20/812* (2025.01)
*H10H 29/14* (2025.01)

(58) Field of Classification Search
USPC .................................................. 257/79
See application file for complete search history.

(56) References Cited

U.S. PATENT DOCUMENTS

| | | | |
|---|---|---|---|
| 11,637,219 B2 | 4/2023 | He et al. | |
| 11,688,829 B2 | 6/2023 | Tan et al. | |
| 12,087,881 B2* | 9/2024 | He | H10H 20/825 |
| 2016/0372514 A1 | 12/2016 | Chang et al. | |
| 2020/0111767 A1 | 4/2020 | Hsieh | |
| 2021/0249467 A1 | 8/2021 | He | |
| 2021/0336084 A1 | 10/2021 | Yoon et al. | |
| 2022/0085112 A1 | 3/2022 | Huang | |
| 2022/0302101 A1 | 9/2022 | He | |
| 2023/0117098 A1 | 4/2023 | Chen et al. | |
| 2023/0163238 A1 | 5/2023 | Leung et al. | |

FOREIGN PATENT DOCUMENTS

| | | |
|---|---|---|
| CN | 112420781 A | 2/2021 |
| CN | 113053973 A | 6/2021 |
| CN | 113471270 A | 10/2021 |
| CN | 113594386 A | 11/2021 |
| TW | 201826563 A | 7/2018 |
| WO | 2019079381 A1 | 4/2019 |

OTHER PUBLICATIONS

International Search Report and Written Opinion for PCT Application No. PCT/US2023/060709, mailed on Jun. 7, 2023, 18 pages.

* cited by examiner

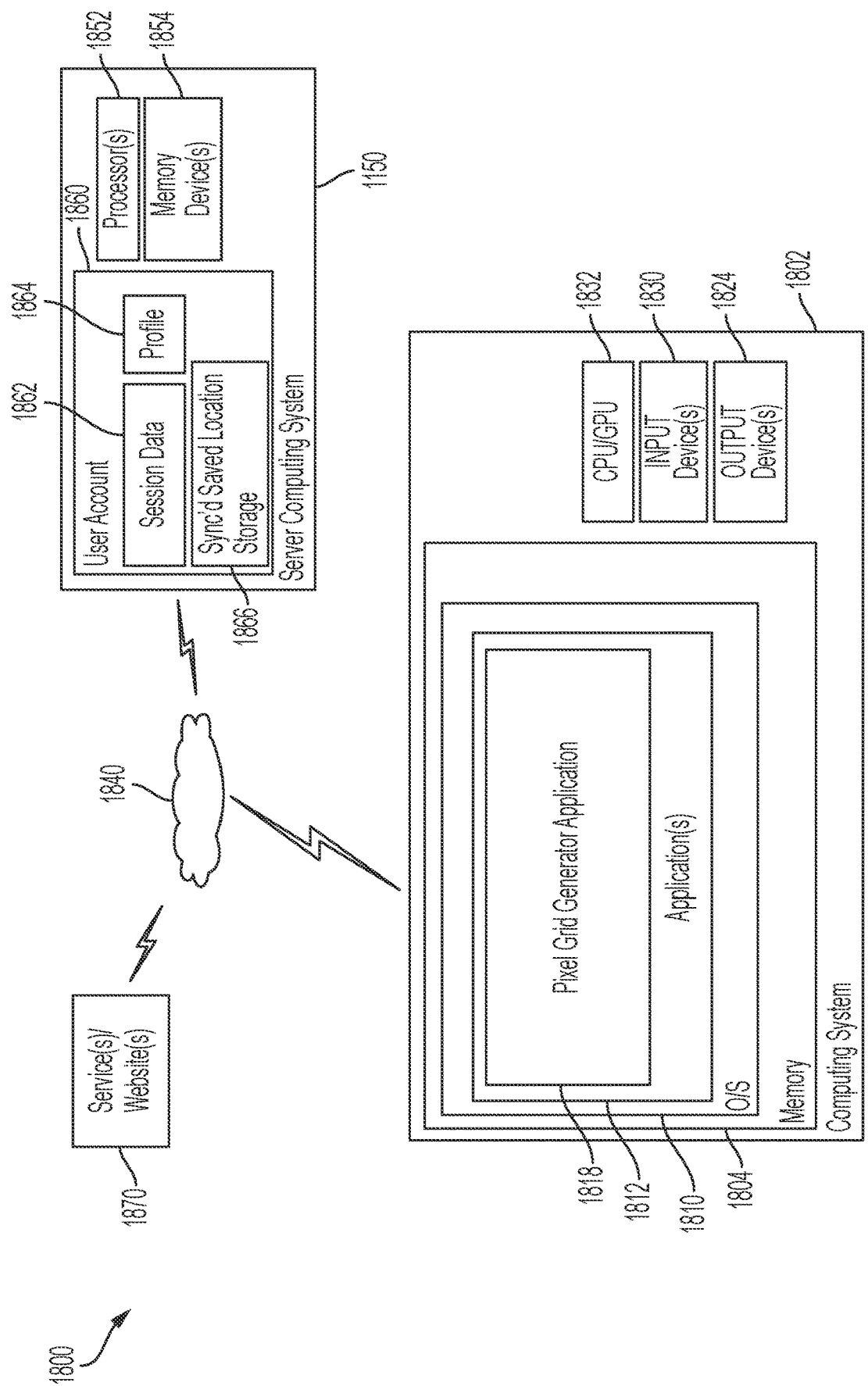

TRICHROME PIXEL LAYOUT

CROSS-REFERENCE TO RELATED APPLICATIONS

This application is a bypass continuation of PCT Application No. PCT/US2023/060709, filed Jan. 16, 2023, which claims the benefit of U.S. Provisional Application No. 63/299,702, filed on Jan. 14, 2022, the disclosures of which are incorporated herein by reference in their entireties.

FIELD OF THE DISCLOSURE

The present disclosure relates to display technology, in particular, micro-LED light emitters for use in heads-up displays and headsets for virtual reality and augmented reality experiences.

BACKGROUND

A mobile display device such as a touch screen or a heads-up display may incorporate a pixel grid, or pixel array, of light producing elements, or emitters. Some display devices use, as light sources, sub-micron sized light emitting diodes, or "micro-LEDs." Each pixel in the array can be formed as a single micro-LED emitter tuned to a specific wavelength, or color, of light e.g., one of the primary light colors—red, green, or blue. Alternatively, each pixel can be formed as a group of micro-LED emitters. The number and arrangement of the constituent micro-LED emitters determine the color and intensity of light emission from each pixel in the array, in response to electrical signals applied to the emitters.

SUMMARY

The present disclosure describes methods and devices that can be used to transform a layout of a densely packed grid of micro-LED light emitters to a layout of a square rectilinear (e.g., substantially square, and rectilinear) grid of micro-LED light emitters for compatibility with hardware and software used in imaging and display technologies. In particular, a pattern of regular hexagonal emitter cells for fabrication on a III-nitride substrate can be transformed to a square pixel grid of irregular trichrome pixels that are readily addressable (e.g., addressable via, for example, a backplane). Separation between adjacent trichrome pixels, and between their constituent emitters, can be established for overlay tolerance, while maintaining a cell packing density of, for example, about 70% and a pixel pitch of, for example, about 4.0 μm. Emitter areas can be adjusted to control optical current density which, in turn, can influence wavelength sensitivity and quantum efficiency of the micro-LED during its operation.

In some aspects, the techniques described herein relate to a display including: a first plurality of III-nitride blue emitters emitting blue light, each blue pixel having a first area; a second plurality of III-nitride green emitters emitting green light, each green pixel having a second area; and a third plurality of III-nitride red emitters emitting red light, each red pixel having a third area; wherein the third area is at least 1.5 times larger than the first area and at least 1.5 times larger than the second area.

In some aspects, the techniques described herein relate to a display, wherein each III-nitride emitter includes at least one InGaN-containing a quantum well.

In some aspects, the techniques described herein relate to a display, wherein the first, second, and third pluralities of emitters are formed monolithically on a III-nitride substrate.

In some aspects, the techniques described herein relate to a display, wherein the red emitters are operated at a current having an associated red current density, and the red emitters are characterized by a wavelength shift of at least 10 nm per current density decade relative to the red current density.

In some aspects, the techniques described herein relate to a display, wherein the red emitters are operated at a current having an associated red current density and the red emitters are characterized by a relative external quantum efficiency (EQE) variation of at least 10% per current density decade relative to the red current density.

In some aspects, the techniques described herein relate to a display, wherein the red emitters are characterized by an internal quantum efficiency of at least 15% and a wavelength of at least 610 nm when the display is operated.

In some aspects, the techniques described herein relate to a display, wherein the red emitters are characterized by an EQE of at least 3% and a wavelength of at least 610 nm when the display is operated.

In some aspects, the techniques described herein relate to a display, wherein the red emitters are characterized by an optical output current density of at least 0.1 Amps/cm2 and a wavelength of at least 610 nm when the display is operated.

In some aspects, the techniques described herein relate to a display, wherein the red emitters are characterized by a filling fraction of at least 15%.

In some aspects, the techniques described herein relate to an apparatus, including: a blue emitter having a hexagonal shape and a blue emitter area; a green emitter having a hexagonal shape and a green emitter area, a first side of the green emitter being parallel to a first side of the blue emitter; and a red emitter having a hexagonal shape and a red emitter area that is greater than the blue emitter area and greater than the green emitter area, wherein a first side and a second side of the red emitter have different lengths.

In some aspects, the techniques described herein relate to an apparatus, wherein the first side of the red emitter is parallel to a second side of the green emitter.

In some aspects, the techniques described herein relate to an apparatus, wherein the second side of the red emitter is parallel to a second side of the blue emitter.

In some aspects, the techniques described herein relate to an apparatus, wherein the length of the second side of the red emitter equals a length of the second side of the blue emitter.

In some aspects, the techniques described herein relate to an apparatus, wherein the second side of the red emitter is separated by a gap from the second side of the blue emitter.

In some aspects, the techniques described herein relate to an apparatus, wherein angles between adjacent sides of the red emitter, adjacent sides of the green emitter, and adjacent sides of the blue emitter are 120 degrees.

In some aspects, the techniques described herein relate to a method, including: selecting a pixel area, a red flux, and a red wavelength for red indium gallium nitride (InGaN) micro-LED light emitters within a pixel array of a display; determining a red emitter area and an operating current density of the red InGaN micro-LED light emitters, such that when the red InGaN micro-LED emitters are operated at the operating current density, light is emitted at least at the red flux with a wavelength of at least the red wavelength, the red emitter area being between 10% and 90% of the pixel area; and fabricating a display that includes a plurality of the red InGaN micro-LED emitters.

In some aspects, the techniques described herein relate to a method, wherein the red wavelength is at least 600 nm.

In some aspects, the techniques described herein relate to a method, wherein the pixel area is less than 5×5 µm2.

In some aspects, the techniques described herein relate to a method, wherein a ratio of the red flux to the red pixel area is at least 0.1 Amp/cm2.

In some aspects, the techniques described herein relate to a method, including: selecting a target pixel area, a target optical crosstalk, a target flux, and a target wavelength for red indium gallium nitride (InGaN) micro-LED light emitters within a pixel array of a display; determining an optical isolation configuration, a pixel layout, and an operating current density of the red InGaN micro-LED light emitters, such that: the pixel layout has an area of about the target pixel area, when the red InGaN micro-LED emitters are operated at the operating current density, light is emitted at least at the target flux with a wavelength of at least the target wavelength, the optical isolation configuration facilitates an optical crosstalk from the pixel to neighboring pixels of the pixel array that is less that the target optical crosstalk; and fabricating a display that includes the optical isolation configuration and a plurality of the red InGaN micro-LED emitters.

In some aspects, the techniques described herein relate to a display, including: a pixel array having a pixel area; and a plurality of red indium gallium nitride (InGaN) micro-light emitting diodes (micro-LEDs) in the pixel array, the red InGaN micro-LEDs having a red flux, a red wavelength, and a red emitter area between 10% and 90% of the pixel area, wherein the display is configured to operate such that the pixel array emits red light at least at the red flux with a wavelength of at least the red wavelength.

In some aspects, the techniques described herein relate to a display, wherein the red InGaN micro-LEDs are formed on a III-nitride semiconductor substrate that includes at least one InGaN-containing quantum well.

In some aspects, the techniques described herein relate to a display, further including a plurality of green InGaN micro-LEDs and a plurality of blue InGaN micro-LEDs, wherein the red InGaN micro-LEDs, the green InGaN micro-LEDs, and the blue InGaN micro-LEDs are formed monolithically on a III-nitride substrate.

In some aspects, the techniques described herein relate to a display, wherein the red InGaN micro-LEDs are characterized by a wavelength shift of at least 10 nm per current decade relative to an operating current density.

In some aspects, the techniques described herein relate to a display, wherein the red InGaN micro-LEDs are characterized by a relative external quantum efficiency (EQE) variation of at least 10% per current decade relative to an operating current density.

In some aspects, the techniques described herein relate to a method, including: transforming a grid of regular hexagonal light emitters, having sides of equal lengths and equal angles between the sides, into a square grid of pixels having a set of at least four pixels within a boundary having a length dimension equal to a width dimension; and transforming the square grid of pixels into a square rectilinear grid of pixels, each of the pixels from the square rectilinear grid of pixels including a first irregular hexagonal light emitter, a second irregular hexagonal light emitter, and a third irregular hexagonal light emitter, the square rectilinear grid of pixels including: a first pixel adjacent to a second pixel, the first pixel having a centroid aligned with a centroid of the second pixel along a first direction, and a third pixel adjacent to the second pixel, the third pixel having a centroid aligned with the centroid of the second pixel along a second direction orthogonal to the first direction.

In some aspects, the techniques described herein relate to a method, wherein each of the regular hexagonal light emitters and irregular hexagonal light emitters has six sides, three median lines that bisect opposite sides of the six sides, and an emitter center point located at an intersection of the three median lines.

In some aspects, the techniques described herein relate to a method, wherein the centroid of each of the square rectilinear grid of pixels is located at a spatial average of the emitter center points of the first irregular hexagonal light emitter, the second irregular hexagonal light emitter, and the third irregular hexagonal light emitter of each of the square rectilinear grid of pixels.

In some aspects, the techniques described herein relate to a method, wherein the centroid of each of the square rectilinear grid of pixels does not intersect with a side of any of the first irregular hexagonal light emitter, the second irregular hexagonal light emitter, or the third irregular hexagonal light emitter of each of the square rectilinear grid of pixels.

In some aspects, the techniques described herein relate to a method, wherein the first irregular hexagonal light emitter is a red emitter, the second irregular hexagonal light emitter is a green emitter, and the third irregular hexagonal light emitter is a blue emitter.

In some aspects, the techniques described herein relate to a method, further including forming a trichrome emitter of a composite color by adjusting relative emitter areas of the red emitter, the green emitter, and the blue emitter.

In some aspects, the techniques described herein relate to a method, wherein adjusting the relative emitter areas includes adjusting lengths of the sides of the first, second, and third irregular hexagonal light emitters to expand or contract corresponding emitter areas.

In some aspects, the techniques described herein relate to a method wherein adjusting the relative emitter areas includes expanding an area of the red emitter and contracting areas of the green and blue emitters.

In some aspects, the techniques described herein relate to a method, wherein each pixel within the square grid of pixels includes three laterally expanded hexagonal light emitters, each having an emitter width and an emitter height, the emitter widths being greater than the emitter heights.

In some aspects, the techniques described herein relate to a method, wherein at least two of the emitter widths within each pixel are different.

In some aspects, the techniques described herein relate to a method, further including: forming isolated pixels within the square rectilinear grid of pixels; and forming a separation between the isolated pixels, at a selected separation distance.

In some aspects, the techniques described herein relate to an apparatus, including: a substrate; a III-nitride layer on the substrate; a layout of trichrome pixels formed in the III-nitride layer, each trichrome pixel having a pixel area and including three monochrome micro-LED emitters having different emitter areas; and a metal contact disposed on a corresponding one of three monochrome micro-LED emitters, the metal contact having a contact area, wherein a ratio of the contact area to the emitter area of the corresponding one of the three monochrome micro-LED emitters is based on a color of the corresponding one of the three monochrome micro-LED emitters.

In some aspects, the techniques described herein relate to an apparatus, further including, within the III-nitride layer, pixel isolation regions defining a pixel separation distance D between adjacent pixels.

In some aspects, the techniques described herein relate to an apparatus, wherein the pixel separation distance D is greater than an emitter separation distance d between adjacent micro-LED emitters.

In some aspects, the techniques described herein relate to an apparatus, wherein the metal contacts have a minimum width of 0.3 μm.

In some aspects, the techniques described herein relate to an apparatus, wherein a total area occupied by the monochrome micro-LED emitters in each trichrome pixel is at least 55% of the pixel area.

In some aspects, the techniques described herein relate to an apparatus, wherein a pixel pitch of the trichrome pixels is less than or equal to 4.0 μm.

In some aspects, the techniques described herein relate to an apparatus, wherein the monochrome micro-LED emitters include red emitters wherein the ratio associated with red emitters is smaller than the ratio associated with other monochrome micro-LED emitters.

In some aspects, the techniques described herein relate to an apparatus, wherein a color of each trichrome emitter pixel is determined by relative emitter areas of the three monochrome micro-LED emitters.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 18 is a block diagram of a computer system for executing the method illustrated in FIG. 3, according to a possible implementation of the present disclosure.

The components in the drawings are not necessarily to scale relative to each other. Like reference numerals designate corresponding parts throughout the several views.

DETAILED DESCRIPTION

Figure 1A:
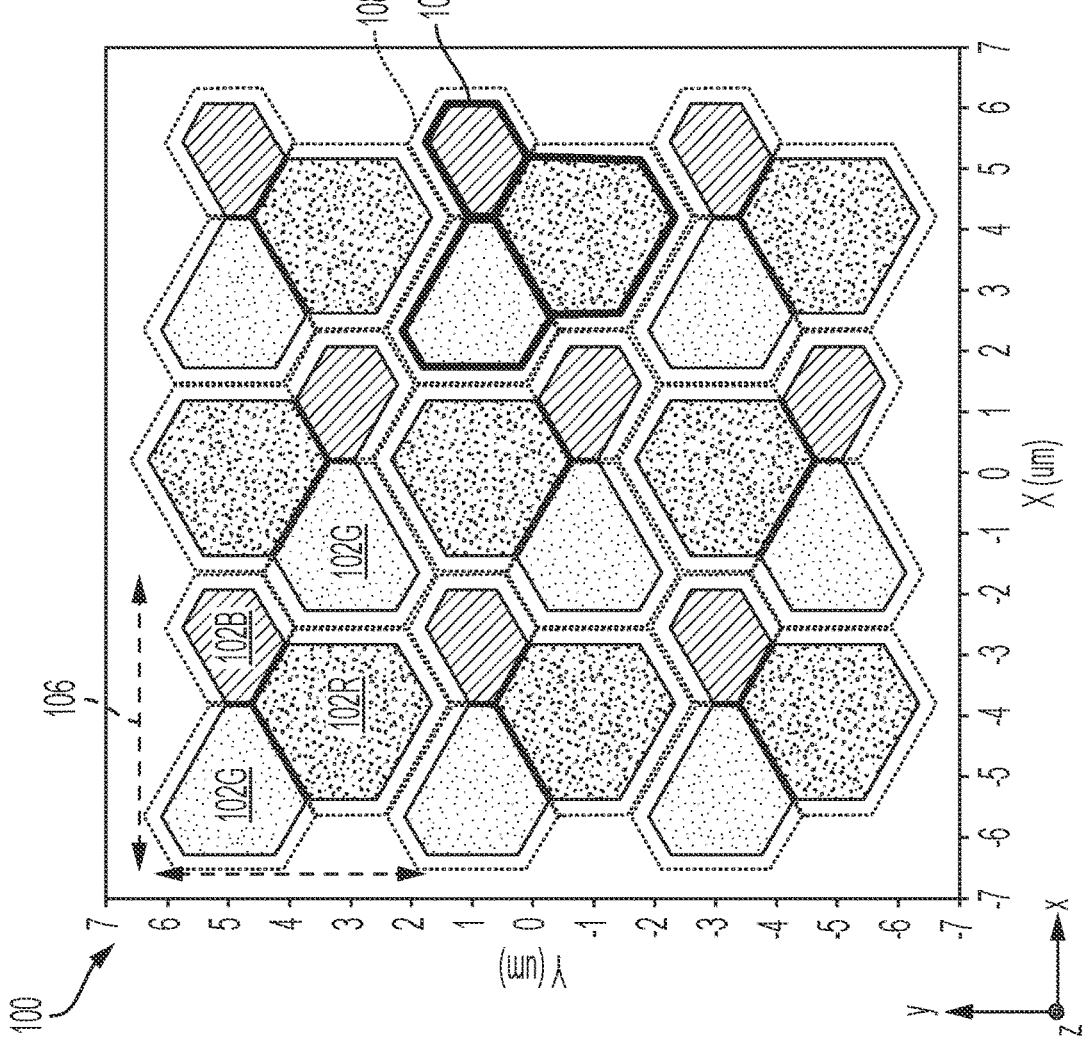
FIG. 1A is a layout of a rectilinear trichrome pixel array according to a possible implementation of the present disclosure.

Some displays make use of hexagonal micro-LED elements that are fabricated on a semiconductor substrate that includes a III-nitride material having a hexagonal crystalline structure. Examples of such III-nitride materials include gallium nitride (GaN), indium gallium nitride (InGaN), aluminum gallium nitride (AlGaN), aluminum indium nitride (AlInN), aluminum indium gallium nitride (AlInGaN), and other alloys. Each micro-LED may correspond to one monochrome emitter, or subpixel, of the display, and a group of three subpixels (e.g., red, green, and blue) may constitute a trichrome pixel.

In some implementations, emitters can be formed monolithically, e.g., all three colors can be formed on a same epitaxial growth substrate, which may be termed a III-nitride substrate. For example, a semiconductor wafer with a GaN buffer (e.g., on sapphire or silicon or bulk GaN) can be used as an epitaxial growth substrate, and micro-LEDs of all three colors can be formed on this substrate by a succession of epitaxial growth operations and other processing operations. The semiconductor wafer may further be processed into semiconductor dice that can be attached to a backplane to form displays.

A simple layout of an array, or grid, of hexagonal micro-LED emitters can be problematic because the groups of three emitters that form pixels are not properly aligned to allow for ease of addressing. Consequently, such an array may be incompatible with existing software or hardware that is set up for use with other array geometries in which the pixels are rectilinear, e.g., aligned in both the x- and y-directions. In addition, a regular hexagonal emitter array forms a rectangular pixel array instead of a square pixel array. Put differently, when the hexagonal emitter shapes are regular, with equal sides and equal angles, the pixel arrangement is irregular, and therefore difficult to access.

Techniques described below can be implemented to alter the hexagonal shapes of the sub-pixels so as to create a pixel array design that is both approximately square and approximately rectilinear. That is, the emitter shapes are stretched to become irregular so that the resulting pixel arrangement becomes regular. In the resulting layout, the sub-pixels have hexagonal shapes with sides of different lengths, causing the different colored emitters to have different areas. Although the cells are still hexagons, their shapes are irregular. In one example, the red emitters have a larger area than the areas of the blue and green emitters, by a factor of 1.5.

One technical effect of transforming the pixel layout in this way is to make the array of hexagonal emitters compatible with existing technology (e.g., hardware and software) used to program and drive displays. Another technical effect is that, by altering the shapes and sizes of the red emitters, the optical current density of the emission changes, which, when operating the array, affects properties of the emitted light, e.g., peak wavelength, wavelength sensitivity, and quantum efficiency. Therefore, transforming the array design is not only more convenient, but changing the layout can also have a direct operational effect on the capabilities of the display device.

FIG. 1A shows a layout of an example of a trichrome pixel array 100, according to a possible implementation of the present disclosure. FIG. 1A is a high-level illustration that will be detailed further in the description below. The trichrome pixel array 100 is a desirable result of a series of transformations described below to address the shortcomings of a display that includes a regular hexagonal emitter array.

The trichrome pixel array 100 groups emitters 102 into a square array of trichrome pixels 104, one of which is shown outlined in black in FIG. 1A. In the example shown, the trichrome pixel array 100 is also a rectilinear 3×3 array of trichrome pixels 104. Alternating trichrome pixels 104 have an inverted (upside down) orientation. In some implementations, each trichrome pixel 104 has three constituent emitters 102, or sub-pixels, so as to include a triad of all three primary light colors. Each trichrome pixel 104 can be manipulated, or scaled, to output a selected color of light by adjusting relative contributions of the three primary color components. The light contributions of each primary color component to create the pixel color can be increased or decreased by adjusting, for example, light intensity of the emitters, or micro-LED cell size, e.g., cell area.

In some implementations, the constituent emitters 102 in each trichrome pixel 104 are monochrome micro-LED emitters of the primary light colors, e.g., a green emitter 102G, a blue emitter 102B, and a red emitter 102R. Blue emitters 102B may be characterized by a peak wavelength in a range of about 430 nm to about 490 nm; green emitters 102G may be characterized by a peak wavelength in a range of about 510 nm to about 570 nm; and red emitters 102R may be characterized by a peak wavelength in a range of about 590 nm to about 680 nm.

Figure 1B:
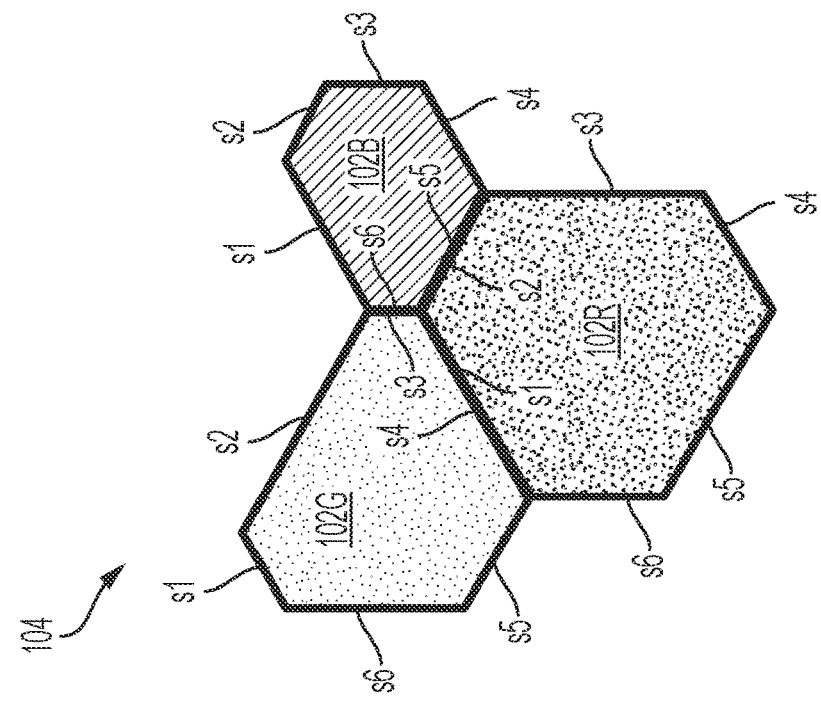
FIG. 1B is a magnified view of a single trichrome pixel in the array shown in FIG. 1A, according to a possible implementation of the present disclosure.

FIG. 1B illustrates an example of a single trichrome pixel 104, magnified for clarity. In some implementations, each emitter 102 within the trichrome pixel 104 has an irregular hexagonal shape in which each of the six sides s1, s2, s3, s4, s5, and s6, has a different length, while the angles between adjacent sides are all equal, e.g., 120 degrees. Within each trichrome pixel 104, one side, e.g, side s4 of the green emitter 102G is parallel to a side, e.g. s1, of the red emitter 102R, and another side, e.g., s3 of the green emitter 102G is parallel to a side, e.g., s6 of the blue emitter 102B. The blue emitter 102B also has a side, e.g., s5 that is parallel to a side, e.g., s2 of the red emitter 102R.

The irregular hexagonal shapes of the various emitters are formed so as to square up dimensions of the trichrome pixel array 100, and subsets thereof. While the hexagonal shapes can appear distorted, the angles between the six sides of each emitter are maintained at about 120 degrees, consistent with a crystal structure of the emitter material. Corners of the hexagonal shapes can be slightly rounded and still fulfill the design of the trichrome pixel array 100.

In particular, some implementations may have a wurtzite crystal structure and LEDs grown along a c-axis of the wurzite structure. In such implementations, hexagonal emitters may have six sides that are aligned with m-axes of the wurtzite structure, or with a-axes of the wurtzite structure. These sides may be vertical, in which case, the sides are respectively m-planes or a-planes, or they may be slanted, in which case the sides may be semipolar planes respectively along c-m axes or along c-a axes.

In some implementations, the areas of the constituent red, green, and blue emitters are different. In the example shown, the area of the red emitter 102R is greater than the area of the green emitter 102G, which in turn is greater than the area of the blue emitter 102B. In one possible implementation, the area of the red emitter 102R is about 1.5 times the area of the green emitter 102G, and about 1.5 times the area of the blue emitter 102B. In one possible implementation, the area of the red emitter 102R is at least 1.5 times the area of the green emitter 102G, and at least 2.0 times the area of the blue emitter 102B. A pixel pitch 106 can be defined as the distance between corresponding emitters in adjacent trichrome pixels 104, e.g., the distance between each pair of closest neighboring green emitters 102G. In the example shown, the pixel pitch 106 is about 4.0 μm in both the x-direction and the y-direction.

The emitters 102 within each trichrome pixel 104 are shown in FIGS. 1A and 1B as being contiguous, however, in some implementations, there can be space, or a gap, between the parallel sides of adjacent emitters 102. The trichrome pixels 104 are shown spaced apart from one another by a pixel perimeter 108. When the emitters 102 and the trichrome pixels 104 are spaced apart from one another, light emission from the trichrome pixel array 100 may be reduced, compared with an array in which the emitters 102 and/or the trichrome pixels 104 are contiguous. However, such spacing may be desirable for other reasons (e.g., ease of fabrication, or addition of optical isolation).

Figure 2B:
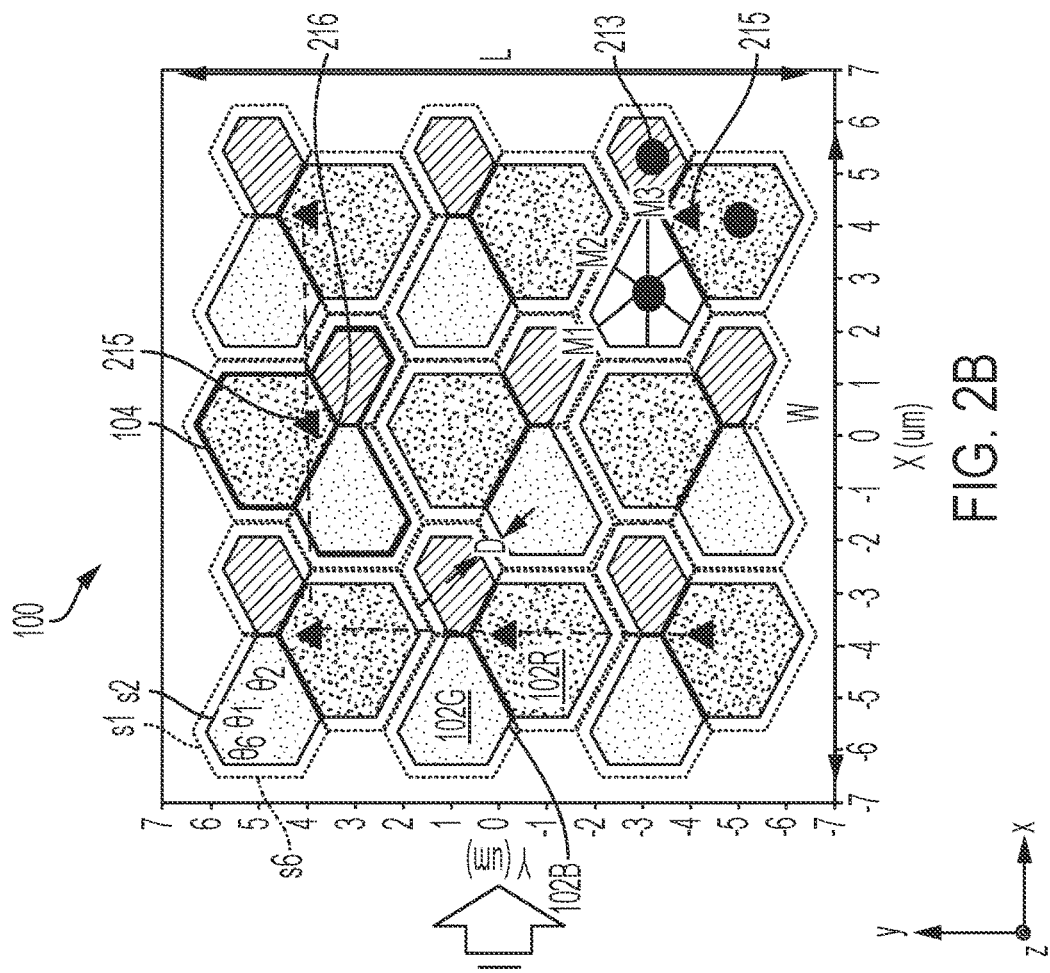
FIGS. 2A and 2B show a layout of a regular hexagonal emitter array and a layout of a rectilinear trichrome pixel array, derived from the layout of the regular hexagonal emitter array, according to a possible implementation of the present disclosure.
Figure 2A:
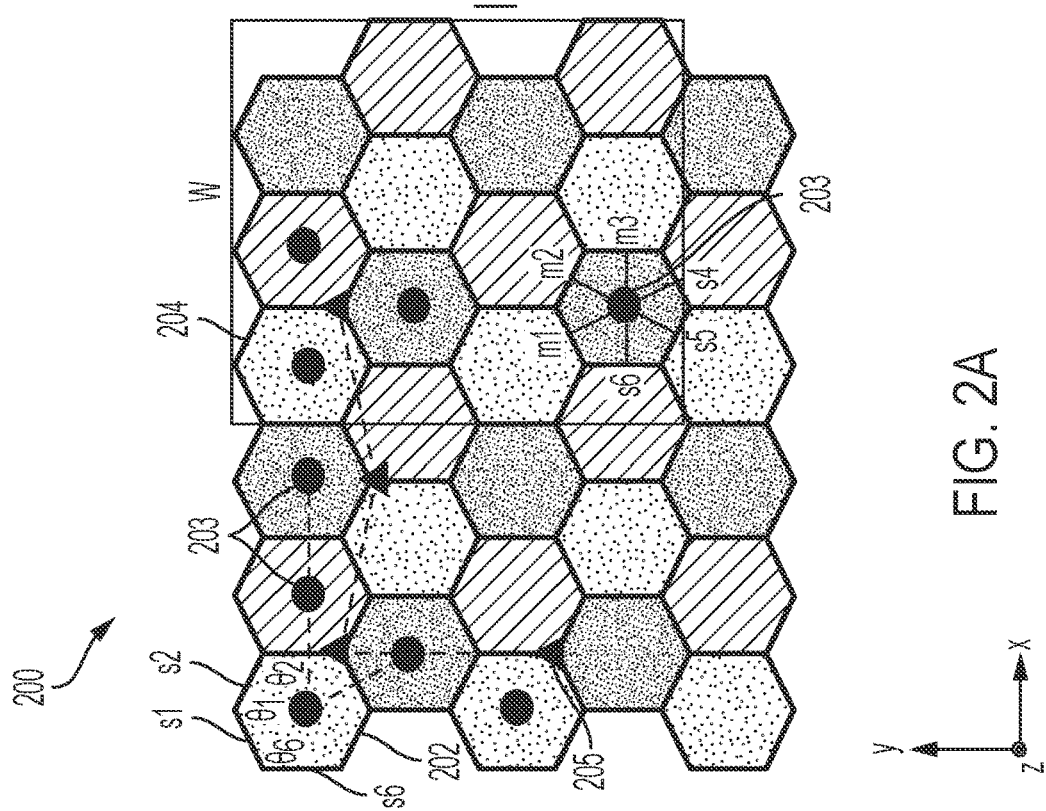

FIG. 2A shows an emitter array 200 of regular hexagonal emitters 202, according to a possible implementation of the present disclosure. The emitter array 200 serves as a starting point, which can undergo various transformations to yield the trichrome pixel array 100, which is reproduced in FIG. 2B. In some implementations, the regular hexagonal emitters 202 are monochrome micro-LED cells, and the shapes of the regular hexagonal emitters 202 in FIG. 2A are regular hexagons, that is, the lengths of the six sides of the regular hexagons, e.g., sides s1, s2 . . . s6, are equal, and the six angles e.g., $\theta_1$, $\theta_2$ . . . $\theta_6$ between adjacent sides of the regular hexagons are each 120 degrees. In some implementations, each monochrome regular hexagonal emitter 202 emits either red, green, or blue light. Regular emitter centers 203, denoted by black circles in FIG. 2A, are each located at the spatial average of points along a perimeter of the hexagonal cell. The regular emitter centers 203 can be determined by constructing median lines that bisect each pair of opposing sides. For example, median line m1 bisects sides s1 and s4; median line m2 bisects sides s2 and s5, and median line m3 bisects sides s3 and s6. The regular emitter center 203 is then located at the intersection of the three median lines m1, m2, and m3.

Each non-overlapping group of three R-G-B regular hexagonal emitters 202 can be grouped into an R-G-B triad 204. An example of an R-G-B triad 204 is outlined in black in FIG. 2A. The R-G-B triad 204 has a triad center 205, symbolized in FIG. 2A by a black triangle. Because the regular hexagonal emitters 202 have regular hexagonal shapes, the triad center 205 is located at the intersection of the three regular hexagonal emitters 202 within the R-G-B triad 204.

It can be advantageous to form a layout of regular hexagonal emitters 202 as in the emitter array 200 to maximize the packing density of the regular hexagonal emitters 202. In FIG. 2A, there is no space between the regular hexagonal emitters 202, that is, all of the regular hexagonal emitters 202 are contiguous, or in contact with one another, such that a fill factor characterizing the filled area of the emitter array 200 is 100%. In some examples, the regular hexagonal emitters 202 can be separated from one another by a separation distance so that the regular hexagonal emitters 202 are not contiguous and the fill factor is less than 100%. However, the fill factor for such an emitter array 200 having isolated regular hexagonal emitters 202 would still be significantly greater than a target of, for example, 60%.

Another advantage of hexagonal cells is that micro-LED emitters formed in a III-nitride substrate, (e.g., a gallium nitride (GaN) substrate, or in a GaN layer on another type of substrate), take on the hexagonal crystal structure of GaN, in which crystal planes have a separation angle of 120 degrees. That is, the hexagonal shape of the regular hexagonal emitters 202 is intrinsic to the crystal structure of GaN-based micro-LED cells. In some implementations, other substrate materials can be used, e.g., other materials that have a hexagonal crystal structure such as, for example, silicon carbide (SiC), in particular 4H-SiC.

One problem with the emitter array 200 shown in FIG. 2A is that the emitter array 200 is not rectilinear. That is, the emitter centers 203 of adjacent regular hexagonal emitters 202 are aligned only in one direction, e.g., the x-direction, not in the y-direction, as shown by the dashed lines connecting adjacent circular emitter centers 203. Similarly, the triad centers 205 are aligned only in one direction, e.g., the y-direction, not in the x-direction, as shown by the dashed lines in FIG. 2A that connect adjacent triangular pixel centers 205. This is a result of every other R-G-B triad 204, being in a reverse orientation with respect to its neighboring triads.

Another problem with the emitter array 200 shown in FIG. 2A is that the emitter array 200 is not square. That is, the size of an n×n-subset of the emitter array 200 does not have substantially equal horizontal (width w) and vertical (length l) dimensions in the x- and y-directions, respectively. For example, in FIG. 2A, the width w of a 2×2 subset of the emitter array 200, containing four adjacent R-G-B triads 204, is shorter than its length l, such that a boundary of the 2×2 subset, shown as a solid box in FIG. 2A, is not square. This is shown in greater detail in FIG. 4.

FIG. 2B shows, for comparison with FIG. 2A, the trichrome pixel array 100, which is a square, rectilinear array of emitters 102 having irregular hexagonal shapes, according to a possible implementation of the present disclosure. In some implementations, the emitters 102 are monochrome micro-LED emitters, and the shapes of the emitters 102 in FIG. 2B are irregular hexagons, that is, the lengths of the sides of the hexagons, e.g., sides S1, S2, . . . S6 are not equal. However, despite their irregular hexagonal shapes, the angles e.g., $\theta_1, \theta_2 \ldots \theta_6$ between adjacent sides of emitters 102 are maintained at 120 degrees. In some implementations, as described above, each of the emitters 102 is a monochrome emitter that emits either red, green, or blue light. An emitter center 213, symbolized by a black circle is located at the spatial average of points along the perimeter of the emitter 102. The emitter center 213 of an emitter 102, in spite of its irregular shape, can be found geometrically by constructing the three medians M1, M2, and M3 and determining the location of their intersection, similarly as explained above for the regular hexagonal emitters 202.

Each non-overlapping R-G-B triad of irregular hexagonal emitters 102 is defined as the trichrome pixel 104. An example of a trichrome pixel 104 is outlined in black in FIG. 2B. The trichrome pixel 104 has a pixel centroid 215, symbolized in FIG. 2B by a black triangle. Because of the odd shapes of the constituent irregular hexagonal emitters 102, the pixel centroids 215 generally do not coincide with sides or corners, or an intersection 216 of the irregular hexagonal emitters 102. Instead, the pixel centroid 215 is located at the spatial average of each of the emitter centers 213 of the emitters 102 within the trichrome pixel 104. Thus, the pixel centroid 215 is located above the intersection of the irregular hexagonal emitters 102 within the trichrome pixel 104. In the neighboring trichrome pixels to the left and to the right of each trichrome pixel 104, pixel centroids 215 are located below, e.g., are offset from, the intersection of the constituent emitters 102 because neighboring trichrome pixels in the x-direction are inverted relative to the trichrome pixel 104.

In the example shown in FIG. 2B, the trichrome pixel array 100 is rectilinear such that adjacent pixel centroids 215 are substantially aligned in both the x- and y-orthogonal directions along the dashed lines shown in FIG. 2B. With the pixel centroids 215 being so aligned, it is possible to reference their positions along common axes so that the pixels 204 are easily addressable (e.g., addressable via, for example, a backplane). Therefore, it can be advantageous to arrange trichrome pixels 104 in such a rectilinear array for ease of programming and applying control signals, and to conform with conventional displays. These advantages do not require that the alignment of the pixel centroids 215 be exact. For example, at the upper left pixel 104 where the dashed lines come together, the corner marked by a pixel centroid 215 can be a somewhat rounded corner, and the advantages of the arrangement shown in FIG. 2B over that shown in FIG. 2A, will still apply.

Further, the trichrome pixel array 100 is a square grid array in which a width W of the 3×3 trichrome pixel array 100 is approximately equal to its length L. In addition, n×n subsets of the trichrome pixel array 100, e.g., any 2×2-pixel array within the trichrome pixel array 100, is also square, having substantially equal horizontal (width) and vertical (length) dimensions in the orthogonal x- and y-directions, respectively.

In the trichrome pixel array 100 shown in FIG. 2B, adjacent trichrome pixels 104 are spaced apart from one another by a distance D. Because of the spaces between the trichrome pixels 104, the fill factor for the square rectilinear grid shown in FIG. 2B is less than 100%, e.g., in the example shown, the fill factor is about 70%. Thus, the packing density of emitters 102 is somewhat compromised by the square rectilinear arrangement of the trichrome pixels 104, in order to achieve the desired alignment.

Figure 3:
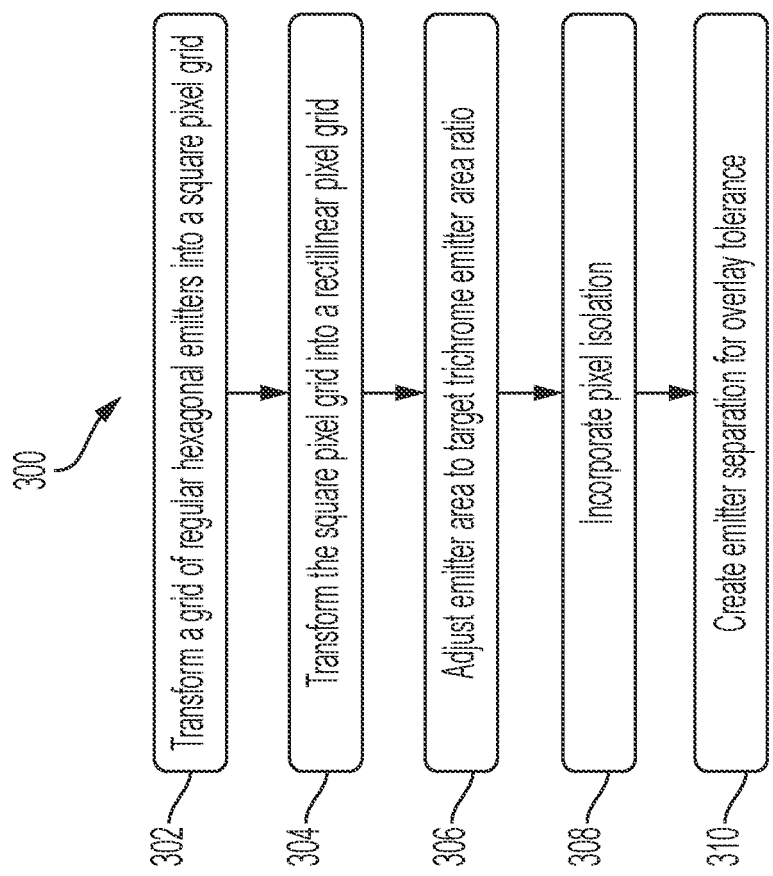
FIG. 3 is a flow chart of a method for transforming the regular hexagonal emitter array shown in FIG. 2A to the rectilinear trichrome pixel array shown in FIG. 2B, according to a possible implementation of the present disclosure.

FIG. 3 illustrates a method 300 for transforming the emitter array 200 to the trichrome pixel array 100, according to a possible implementation of the present disclosure. The method 300 outlines a series of steps for transforming the emitter array 200 of regular hexagonal emitters 202 to a square rectilinear trichrome pixel array 100 of trichrome pixels 104. For illustrative purposes, operations illustrated in FIG. 3 will be described with reference to geometric transformations, as illustrated in FIGS. 4-9 which are intermediate views of arrays at various stages of their transformation according to some implementations. Operations of method 300 can be performed in a different order, or not performed, depending on specific applications. It is noted that method 300 may not produce a complete trichrome pixel array. Accordingly, it is understood that additional processes can be provided before, during, or after method 300, and that some of these additional processes may be briefly described herein. In a possible implementation, the method 300 includes operations 302-310 as described below, with reference to FIGS. 4-10.

Figure 4:
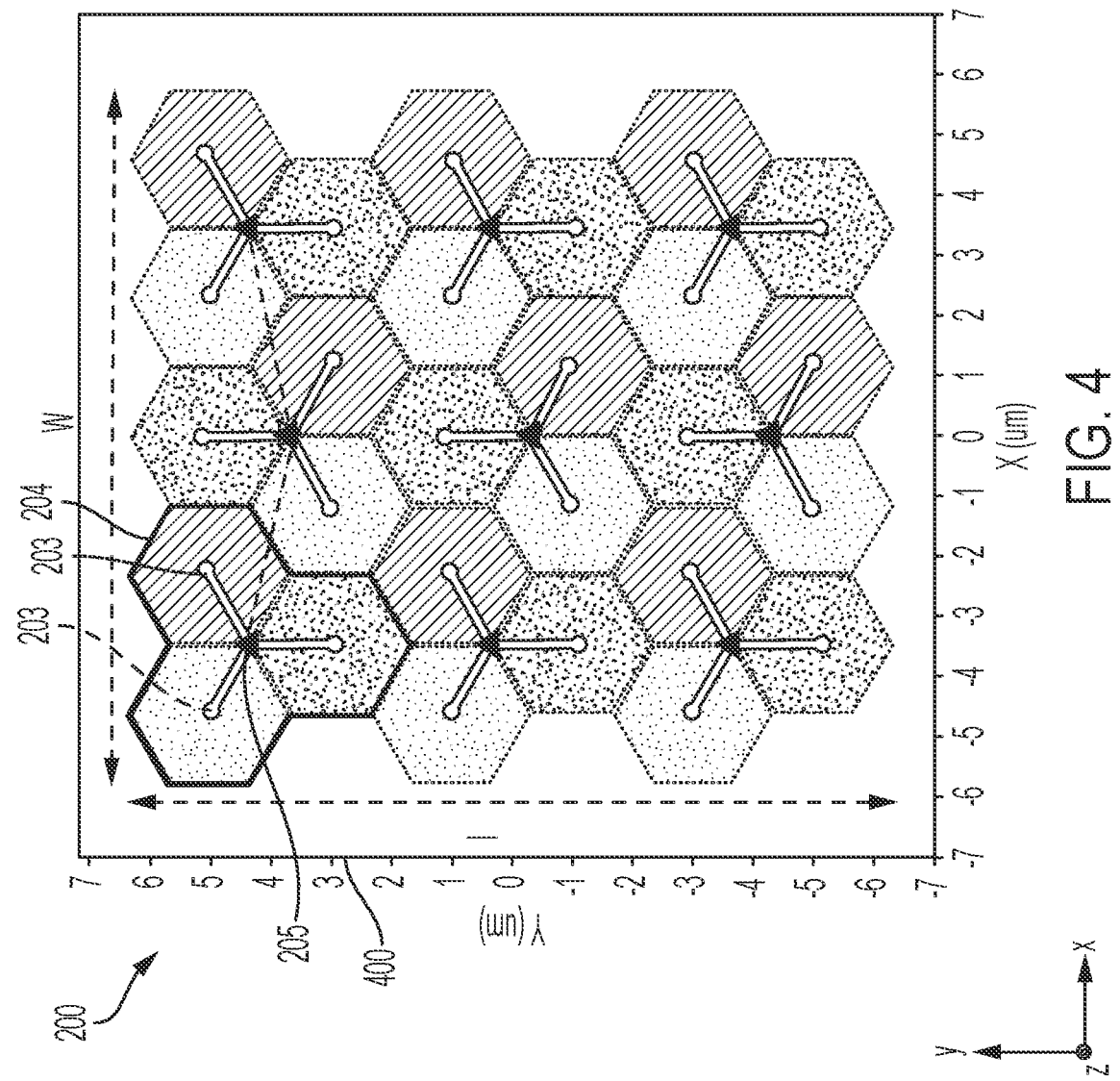
FIGS. 4-10 illustrate operations in the method shown in FIG. 3, according to a possible implementation of the present disclosure.

FIG. 4 superimposes, onto a graph 400, the layout of the emitter array 200 shown in FIG. 2A, highlighting its drawbacks. FIG. 4 shows that the boundary of a 3×3 grid of R-G-B triads 204 is not square, and that, if trichrome pixels were defined as the R-G-B triads 204, the resulting pixel grid would not be rectilinear. In FIG. 4, each R-G-B triad is represented by a "Y" connecting emitter centers 203. The center of each "Y" coincides with the triad center 205. The triad centers 205, symbolized by black triangles, are collinear in the y-direction, but not in the x-direction, as shown by the dashed lines. Consequently, a pixel grid based on the emitter array 200 would not be rectilinear. Further, the emitter array 200, as measured against the graph 400, has a width of about 11.6 µm and a length of about 12.8 µm, which shows that the emitter array 200 is not square.

Figure 5:
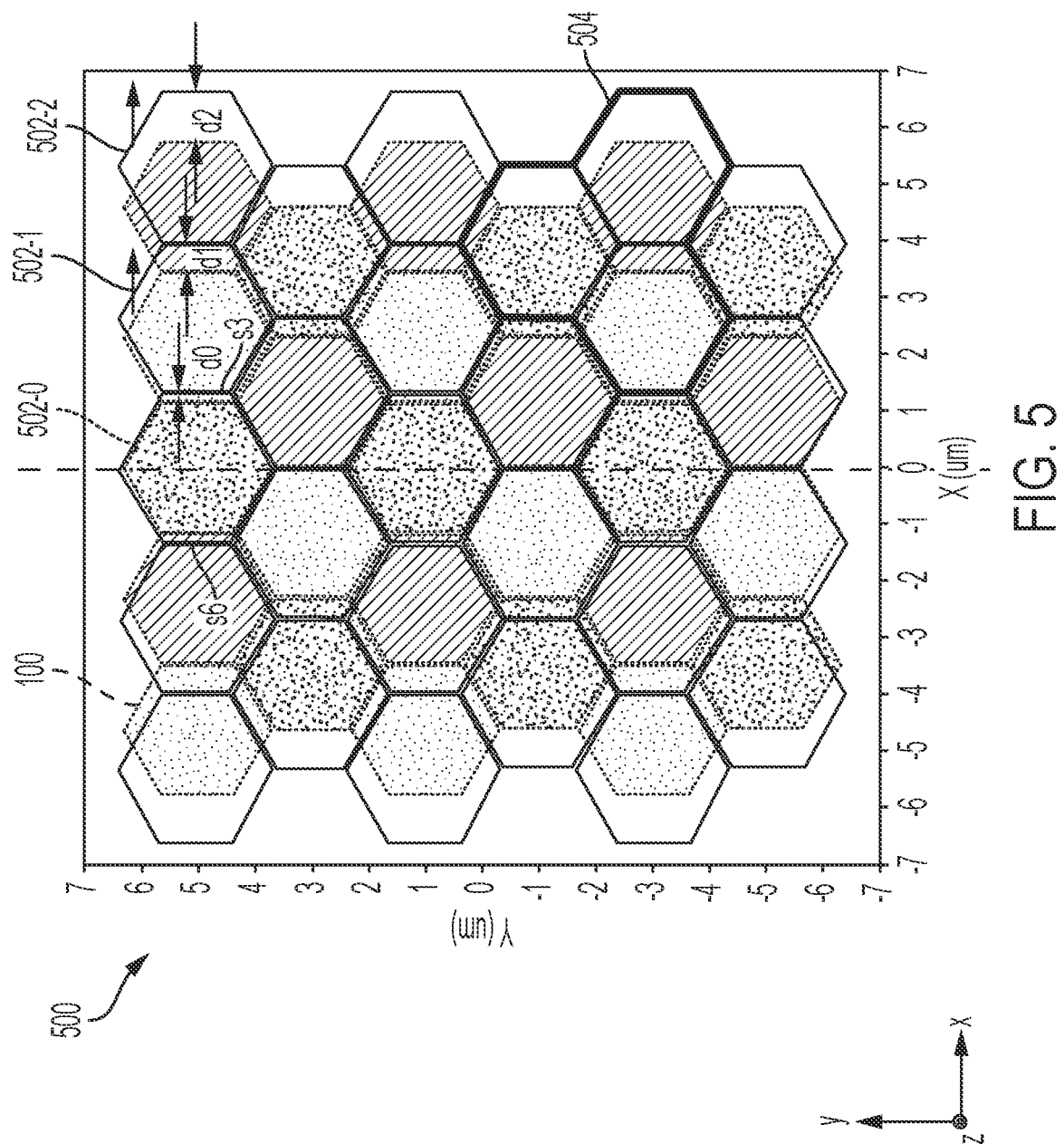

At 302, the emitter array 200 of regular hexagonal emitters 202 can be transformed into a square emitter array 500 as shown in FIG. 5, according to a possible implementation of the present disclosure. The square emitter array 500 is an intermediate layout that can be computer-generated in accordance with a set of design rules. FIG. 5 shows the square emitter array 500 as solid lines, superimposed on the emitter array 200, shown as dotted lines.

In a possible implementation, a transformation to the square emitter array 500 entails a process of lateral expansion of the regular hexagonal emitters 202 to create widened hexagonal emitters 502 (three shown, 502-0, 502-1, and 502-2), while maintaining the angles and the heights of the widened hexagonal emitters 502. Because the original emitter array 200 is longer than it is wide, lateral expansion of the regular hexagonal emitters 202 will increase their widths to square up the emitter array 200. Starting at a central axis of the emitter array 200, shown as a dashed line, the right side s3 of a central widened hexagonal emitter 502-0 is extended, or stretched, in the +x-direction by a distance d0, and the left side of the widened hexagonal emitter 502-0 is extended in the −x-direction by the same distance d0. Meanwhile, the right side of a widened hexagonal emitter 502-1, disposed to the right of the widened hexagonal emitter 502-0, is extended in the +x-direction by a distance d1, greater than d0. Likewise, the right side of a widened hexagonal emitter 502-2, disposed to the right of the widened hexagonal emitter 502-1, is extended in the +x-direction by a distance d2, greater than d1, and so on. A similar set of lateral expansions can be made in the −x direction to hexagonal emitters disposed to the left of the central widened hexagonal emitter 502-0. The distances d0, d1, and d2 . . . dn can be chosen so as to square up the dimensions of the overall square emitter array 500, as well as any n×n subset of non-overlapping R-G-B triads 504, e.g., a resulting single R-G-B triad 504 will have substantially equal length and width dimensions, and a 4×4 subset of R-G-B triads 504 will also have substantially equal length and width dimensions.

In a possible implementation, when the original emitter array 200 has a width w that is greater than its length l, a transformation to the square emitter array 500 may entail vertical expansion of the heights of the regular hexagonal emitters 102 to create lengthened emitters, instead of the lateral expansion described above that produces widened emitters 502. In such a case, both the angles and the widths of the hexagonal emitters 502 would be preserved, while the heights are increased.

Figure 6:
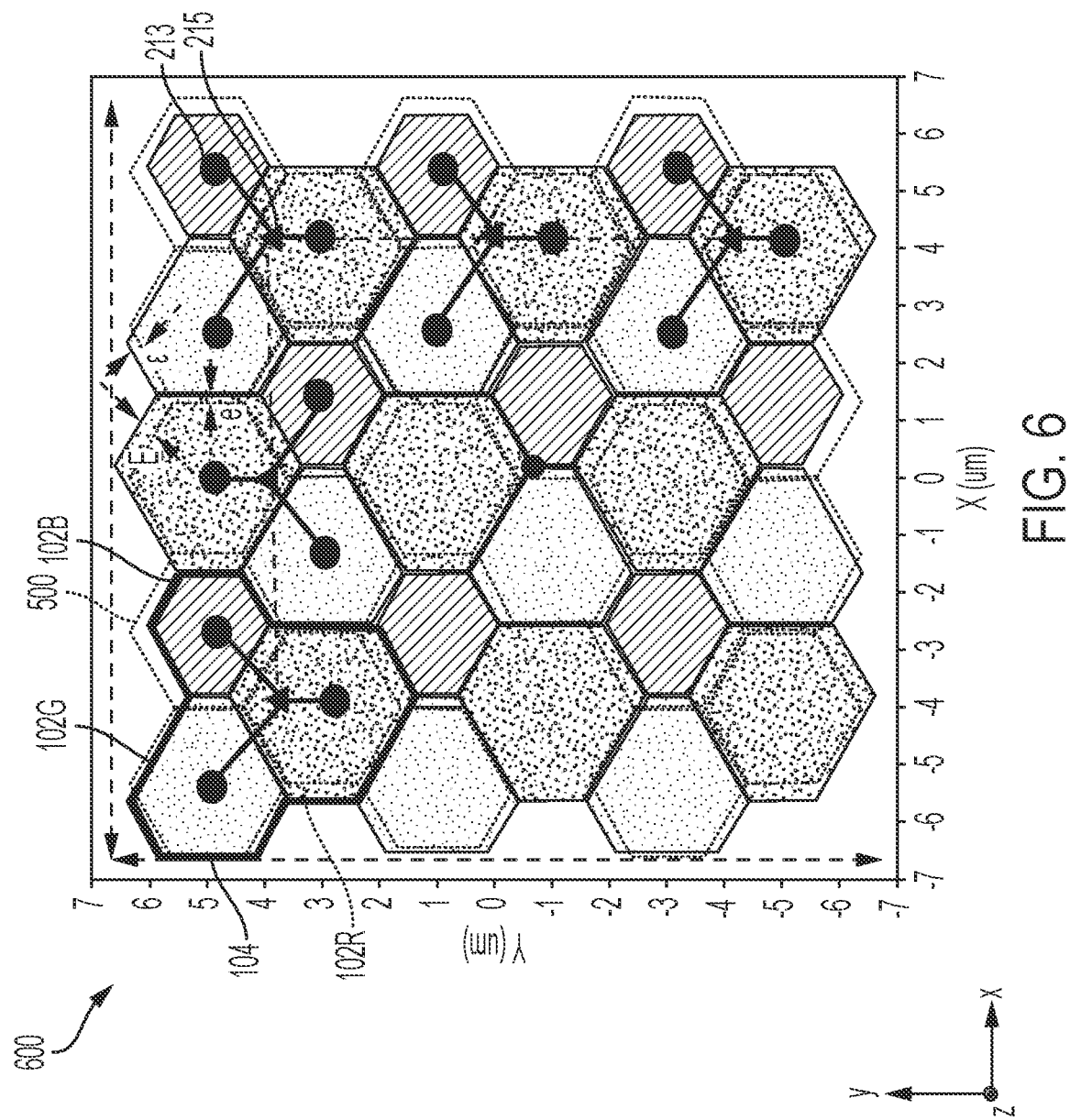

At 304, the square emitter array 500 can be transformed into a square rectilinear trichrome pixel array 600 of trichrome pixels 104, as shown in FIG. 6, according to a possible implementation of the present disclosure. The square rectilinear trichrome pixel array 600 is an intermediate layout that can be computer-generated in accordance with a set of design rules. The square rectilinear trichrome pixel array 600 is referred to as a pixel array, rather than an emitter array, because the repeating element in the array is now a trichrome pixel 104, outlined in black in FIG. 6.

Trichrome pixels 104 make up a rectilinear pixel grid when the trichrome pixels 104 are collinear in each of two orthogonal directions. FIG. 6 shows the square rectilinear trichrome pixel array 600 in solid lines, superimposed on the square pixel array 500, which is shown as dotted lines. Like the square emitter array 500, the square rectilinear trichrome pixel array 600 has a fill factor of 100% because the trichrome pixels 104 are contiguous.

At 306, a transformation to the square rectilinear trichrome pixel array 600 entails a process of further lateral expansion or contraction of the stretched hexagonal emitters 502. Expanding or contracting selected sides of the emitters may adjust the relative emitter area occupied within each trichrome pixel 104. In a possible implementation, transforming to the square rectilinear trichrome pixel array 600 creates irregular hexagonal emitters 102, while maintaining their original 120-degree angles, that is, each apex of the hexagon retains a 120-degree angle. In the example shown in FIG. 6, all sides of the red emitters 102R are expanded, but sides s2, s4, and s6 are expanded toward blue emitters 102B by a larger distance E, while sides s1, s32, and s5 are expanded toward green emitters 102G by a smaller distance e. Expansion of the sides of the red emitters 102R increases their emitter areas. In addition, all sides of the blue emitters 102B are contracted, but sides s2, s4, and s6 bordering green emitters 102G are contracted by the smaller distance e, while sides s1, s3, and s5 are contracted by the larger distance E. Contraction of the sides of the blue emitters 102B decreases their emitter areas. In addition, some sides of the green emitters 102G are contracted and other sides of the green emitters 102G are expanded. In the example shown, sides s2, s4, and s6 bordering red emitters 102R are contracted by the smaller distance e, while sides s1, s3, and s5 bordering blue emitters 102B are expanded by an intermediate distance $\varepsilon$, wherein $e<\varepsilon<E$. The areas of the green emitters 102G therefore may increase, decrease, or remain the same. The irregular hexagonal emitters 102R, 102G, and 102B have emitter centers shown in FIG. 6 as black circles. Like the regular hexagons of pixel array 100, the emitter centers associated with irregular hexagonal emitters 102 are located at the intersection of three median lines that bisect opposite sides of the hexagonal shapes. Pixel centroids 215 of trichrome pixels 104 are symbolized by black triangles in FIG. 6. The pixel centroids 215, are located by finding the spatial average of the red emitter center, the green emitter center, and the blue emitter center. The pixel centroids 215 are collinear in both the x-direction and the y-direction, which are orthogonal to one another, as indicated by the dashed lines. Thus, the trichrome pixels 104 making up the square rectilinear trichrome pixel array 600 have been made rectilinear by expanding and contracting the various emitters 102 as described above. It is noted that the intersection points where the three irregular hexagonal emitters 102 come together are not rectilinear, since they are not collinear in the x-direction.

In FIG. 6, expansion and contraction distances E, e, and c can be chosen so as to result in a desired pixel color, which can be determined by relative areas of the red emitters 102R, the green emitters 102G, and the blue emitters 102B, which are not equal to one another. When the respective emitter areas of the red, green, and blue emitters 102R, 102G, and 102B, make up the same percentage of the pixel areas of trichrome pixels 104, as they do in FIG. 6, a composite pixel color will be uniform across all of the trichrome pixels 104 in the square rectilinear trichrome pixel array 600. In the example shown, the areas of the red and green emitters, 102R and 102G, are larger than the areas of the blue emitters 102B, and so the red and green emitters will have a greater contribution to the composite pixel color than the blue emitters. In some implementations, the ratio of the red, green, and blue emitter areas can be 3:2:1. However, the relative areas can change for different choices of the expansion and contraction distances. In some implementations, the pixel color can vary when constituent emitters are illuminated at different power levels, causing differences in light intensity among the three emitters.

Figure 7:
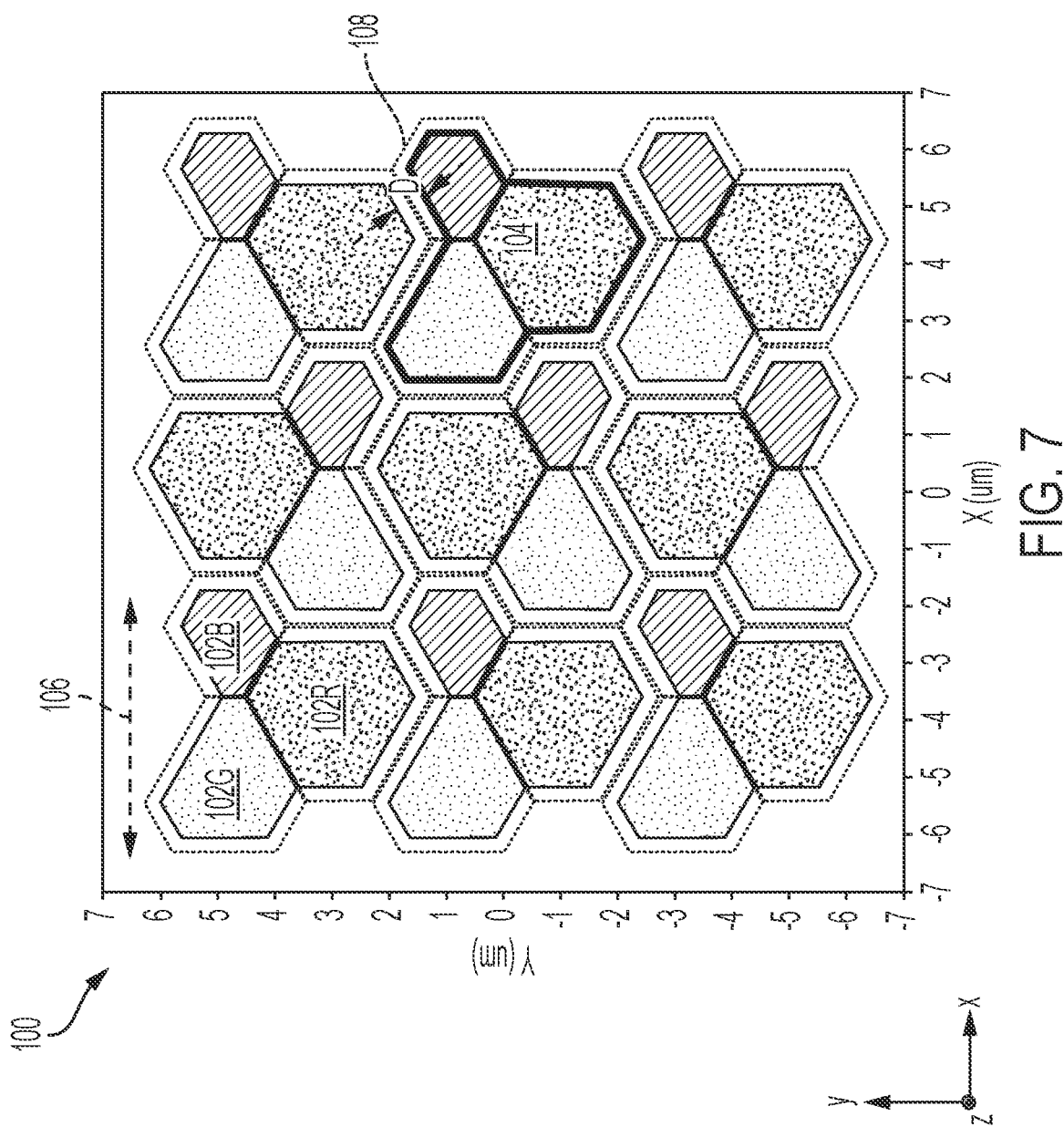

At 308, pixel isolation can be incorporated into the square rectilinear trichrome pixel array 600, as shown in FIG. 7, to create the trichrome pixel array 100, according to a possible implementation of the present disclosure. The trichrome pixel array 100 includes a gap between each of the adjacent irregular hexagonal trichrome pixels 104. In some implementations, gaps can be formed in the layout of the rectilinear trichrome pixel array 100 by constructing the pixel perimeter 108 of a constant width D/2 around each of the trichrome pixels 104, so that adjacent trichrome pixels 104 are separated from one another by a total pixel separation distance D. In some implementations, the pixel separation distance D can be about 0.25 µm. In FIG. 7, boundaries of the trichrome pixels 104 are shown as solid lines and the pixel perimeters 108 are shown as dotted lines. In some implementations, the pixel perimeters 108 can be formed by contracting the boundaries of the trichrome pixels 104. In some implementations, the pixel perimeters 108 can be formed by expanding the dimensions of the trichrome pixel array 100 and adding space between the trichrome pixels 104.

In some implementations, the pixel separation distance D can be chosen so as to achieve the desired pixel pitch 106, defined as the distance between corresponding features of adjacent trichrome pixels 104 e.g., a distance from one green emitter to the next green emitter. In some implementations, the desired pixel pitch 106 is less than or equal to about 4 µm for a square isolated trichrome pixel array 100 that measures about 11 µm×11 µm. With the introduction of pixel isolation, the resulting isolated trichrome pixel array 100 has a fill factor that is less than 100%. In some implementations, the pixel separation distance D can be chosen to meet a minimum design target that specifies a fill factor of, for example, at least 60%.

Figure 8:
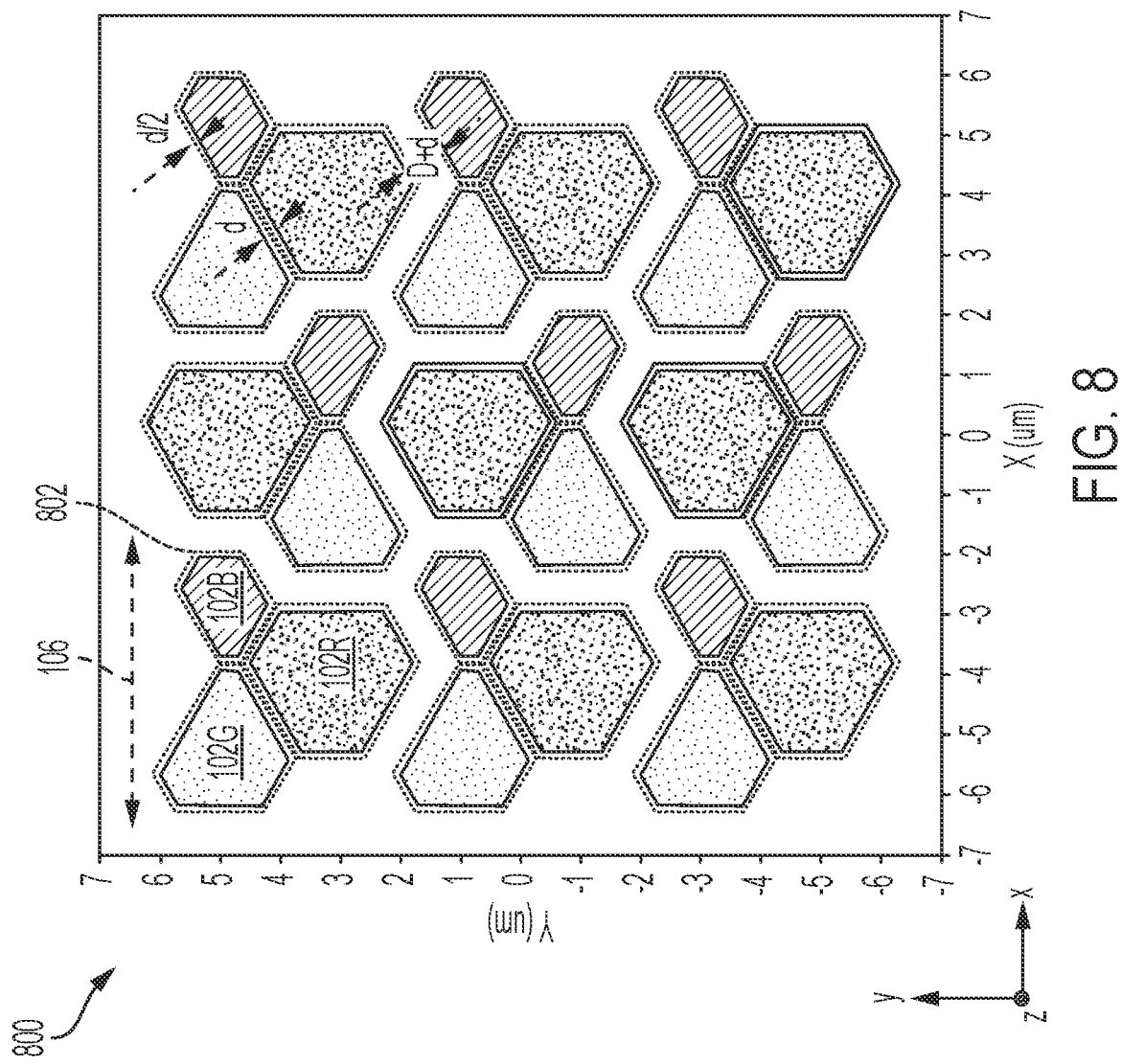

At 310, emitters within each trichrome pixel 104 can be separated to create an isolated trichrome pixel array 800 as shown in FIG. 8, according to a possible implementation of the present disclosure. In some implementations, the isolated trichrome pixel array 800 includes gaps between adjacent trichrome pixels 104 as well as gaps between adjacent emitters within each trichrome pixel 104. In some implementations, gaps between the emitters can be formed in the layout of the isolated trichrome pixel array 800 by constructing an emitter perimeter 802 of a constant width d/2 around each of the emitters 102, so that adjacent emitters are separated from one another by a total emitter separation distance d. In FIG. 8, the boundaries 804 of the emitters 102 are shown as solid lines and the perimeters 802 are shown as dotted lines. In some implementations, the perimeters 802 can be formed by contracting boundaries of the emitters 102. Using this method, adjacent trichrome pixels 104 will be isolated by a combined separation distance D+d. In some implementations, the perimeters 802 can be formed by expanding the dimensions of the isolated trichrome pixel array 800 and adding space between the emitters 102. In some implementations, the perimeters 802 can be formed by contracting adjoining sides of the emitters 102, while not contracting emitter sides that are not adjoining. Using this method, adjacent trichrome pixels 104 will be isolated by the pixel separation distance D. Using this method, the relative areas of the different colored emitters may change, which may, in turn, alter the overall color of the trichrome pixels 104.

In some implementations, the pixel separation distance D and the emitter separation distance d can be chosen so as to achieve a desired pixel pitch 106, e.g., a pixel pitch of less than or equal to about 4.0 µm. In some implementations, the pixel separation distance D and the emitter separation distance d can be chosen to meet a minimum design target that specifies a fill factor of, e.g., a fill factor of at least 60%. In some implementations, the pixel separation distance D and the emitter separation distance d can be chosen so as to achieve a desired total emitter area within each trichrome pixel 104, e.g., a total emitter area that is at least about 55% of the pixel area.

Figure 9:
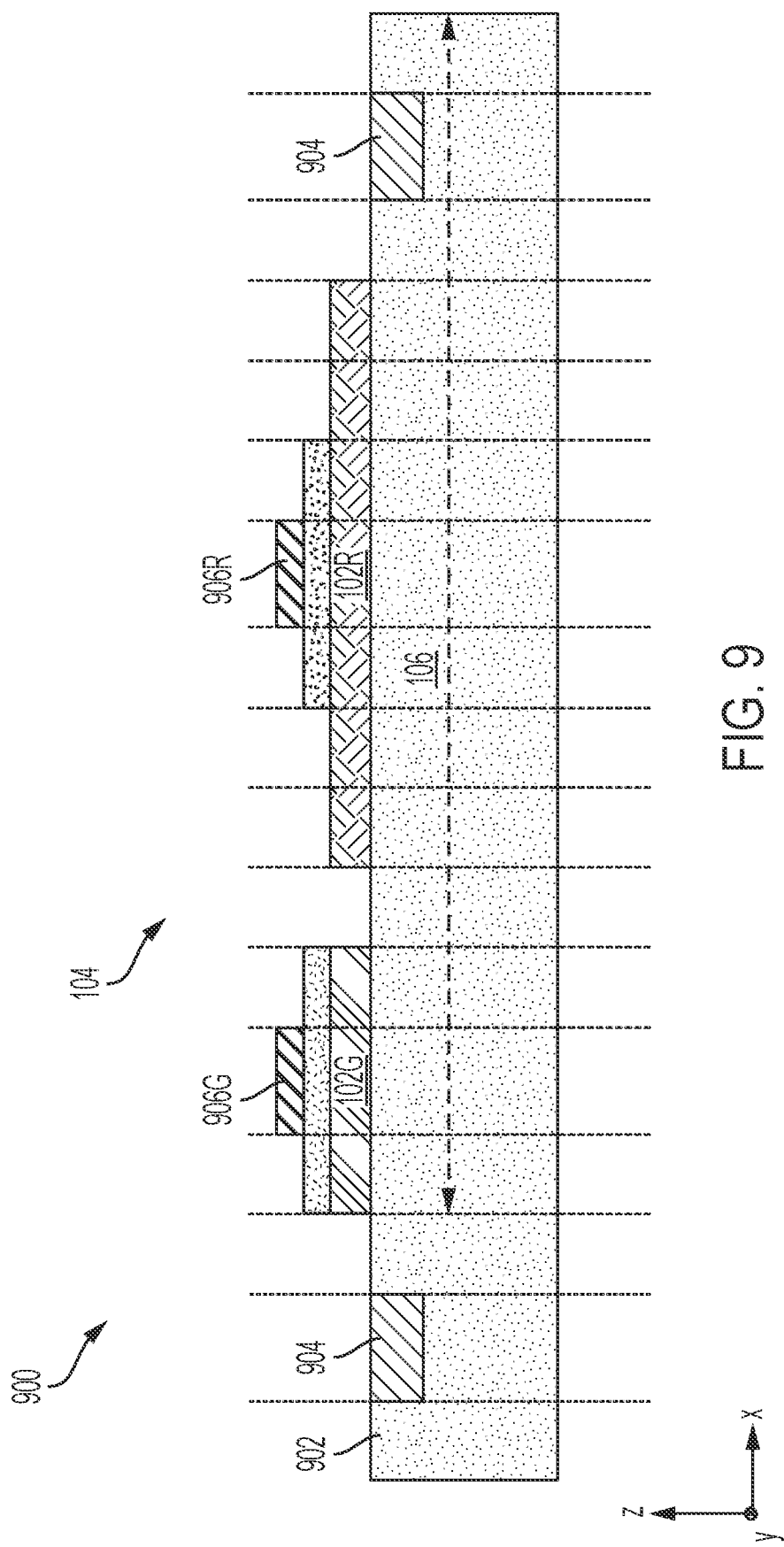

Referring to FIG. 9, gaps can be formed between adjacent pixels, and/or between adjacent emitters, by incorporating an isolation material, according to a possible implementation of the present disclosure. FIG. 9 shows a cross-sectional view 900 of a portion of the trichrome pixel 104 that includes one green emitter 102G and one red emitter 102R. As described above, trichrome pixels 104 can be constructed on a substrate 902 that can include GaN or another III-nitride material. Each micro-LED emitter 102 may have an InGaN-containing active region, e.g., an InGaN quantum well. Red emitters 102R may have InGaN quantum wells in which an indium composition is greater than 20% (e.g., 25%, 30%, or 35%). In some implementations, one or more of the micro-LED emitters, e.g., emitters 102R and 102G, can have sidewalls that are somewhat slanted so that a base of the emitter 102 is wider than an upper surface of the emitter 102, such that the profile of the emitter 102 has the shape of a mesa. From a top-down view, a footprint, or "projected footprint" of the emitter 102 coincides with the area of the base of the emitter 102. The trichrome pixel 104 can have a corresponding footprint that includes red, green, and blue emitter footprints of its constituent emitters 102R, 102G, and 102B, respectively.

To form a gap next to the trichrome pixel 104, or next to the green emitter 102G, a pixel isolation region 904 can be formed in the substrate 902. The pixel isolation region 904 optically isolates the green emitter 102G from adjacent emitters of an adjacent trichrome pixel 104 to the left of the green emitter 102G. The pixel isolation regions 904 can be formed around a pixel, or around a subpixel. In some implementations, the pixel isolation regions 904 can be made of an electrically insulating or dielectric material, or a dielectric stack e.g., including one or more of silicon dioxide ($SiO_2$), silicon nitride (SiN), silicon oxynitride (SiON), aluminum oxide ($AlO_2$), tantalum oxide ($TaO_2$), or titanium oxide ($TiO_2$). In some implementations, the pixel isolation regions 904 can be made of a reflective material such as a metal or a metal stack e.g., including one of more of silver (Ag), aluminum (Al), gold (Au), titanium (Ti), nickel (Ni), platinum (Pt), or combinations thereof. In some implementations, the pixel isolation regions 904 can be made of a dichroic mirror material. In some implementations, the pixel isolation regions 904 can combine dielectric layers and reflective layers. The depth, shape (e.g. angle), and reflectivity of the pixel isolation region 904 may be configured to facilitate a reduction in optical cross-talk between pixels or sub-pixels, that is, to prevent light emitted in one pixel or sub-pixel from propagating laterally past the pixel isolation region 904 to another pixel or sub-pixel.

Some implementations can include methods of jointly configuring the pixel isolation region 904 and the subpixel layout. In some implementations, one or more figures of merit can be chosen from among light extraction efficiency; optical output, expressed as flux or brightness, either radiometric or photometric; crosstalk between pixels; and external quantum efficiency (EQE). Target values can be given for each of the figures of merit. The pixel isolation regions 904 and the micro-LED region can then be configured to satisfy the target values associated with the figures of merit. The pixel pitch 106 and/or a total area of the trichrome pixel 104, may be further constraints.

In an example, the figures of merit for a 4×4 μm pixel area can be specified as: (1) less than 5% of the light emitted by a pixel propagates laterally to neighboring pixels; (2) the brightness of the red subpixel is at least 0.1 W/cm²; and (3) the wavelength of the red subpixel should be at least 620 nm. In this example, the optical isolation can be configured (e.g. its width and depth may be varied) to reduce the cross-talk and achieve (1); then, the area of the red subpixel can be determined to achieve (2) as taught herein; then, the blue and green subpixel areas can be determined from the remaining pixel area; finally, a pixel layout achieving the desired areas can be determined.

Pixel layouts shown herein may correspond to the shapes of various elements. For example, in some implementations, pixel layouts may correspond to a footprint of subpixels, that is, to a shape of a base of micro-mesas forming subpixels. In some implementations, pixel layouts may correspond to a shape of active regions of subpixels (e.g., to the red, green and blue quantum wells). In some implementations pixel layouts may correspond to the shape of a photolithography mask used in fabricating subpixels. In some implementations, the mask may have a hexagonal shape as taught herein and a resulting micro-LED may have a shape that is somewhat distorted from that of the photolithography mask (e.g. a hexagonal shape with rounded apexes, or corners).

It is noted that FIG. 9 further shows sizes of metal contacts 906 (two shown, 906G and 906R) relative to their corresponding emitters 102G and 102R, respectively. The metal contacts 906 are disposed on corresponding emitters formed on the substrate 902. The metal contacts 906 provide access to the emitters 102 for transmission of electrical signals. In the example shown, the metal contacts 906G and 906R are about the same size for both the green emitter 1202G and the red emitter 102R, even though the corresponding areas of the emitters 102G and 102R are significantly different. Therefore, a ratio of the contact area to the emitter area is color-dependent, that is, the ratio of the contact area to the emitter area is based on a color of the emitter.

Figure 10:
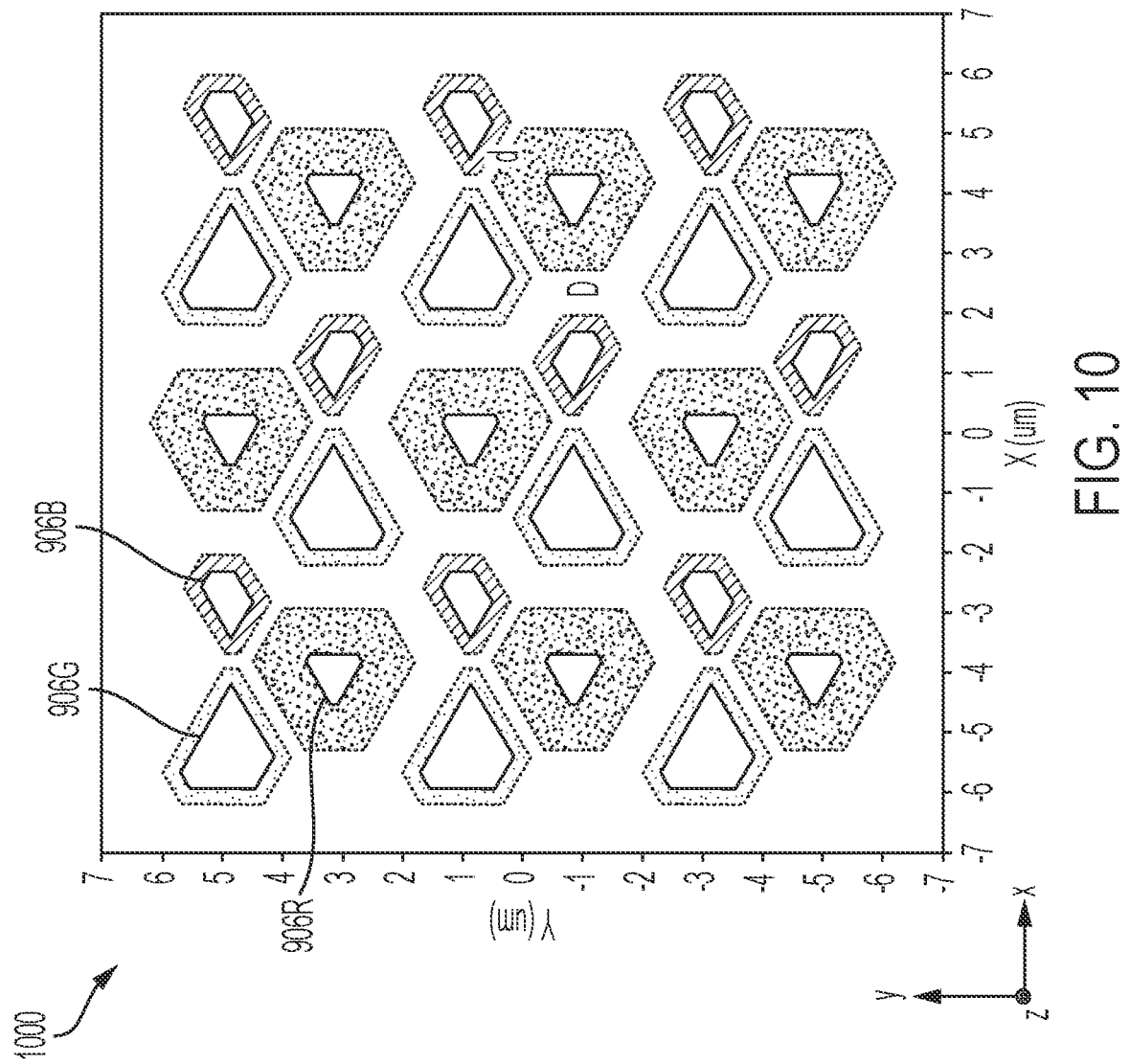

FIG. 10 shows a trichrome pixel array 1000 that has emitter isolation at distance d, pixel isolation at distance D, and metal contacts 906, according to a possible implementation of the present disclosure. In FIG. 10, boundaries of the isolated emitters 102 are shown as dotted lines, and the outlines of the metal contacts 906 are shown as solid lines. In some implementations, the metal contacts 906 are sized differently for each of the emitters 102 so that the metal contacts 906G, 906R, and 906B have unequal contact areas. Further, the sizes of the metal contacts 906 may not scale with their corresponding emitter areas. For example, as shown in FIG. 10, the metal contact 906R is the smallest of the three metal contacts, even though the emitter 102R has the largest emitter area of the three emitter areas. Sizes of the metal contacts 906 can be chosen so as to satisfy a design rule governing a minimum contact width, e.g., 0.3 μm.

Some implementations of the present disclosure benefit from a display design that uses a red III-nitride micro-LED with improved pixel configuration, due to special properties of III-nitride red micro-LEDs. In particular, III-nitride red micro-LEDs may be characterized by a relatively large variation in internal quantum efficiency (IQE) and in light emission wavelength as a function of the input electrical current density.

Figure 11:
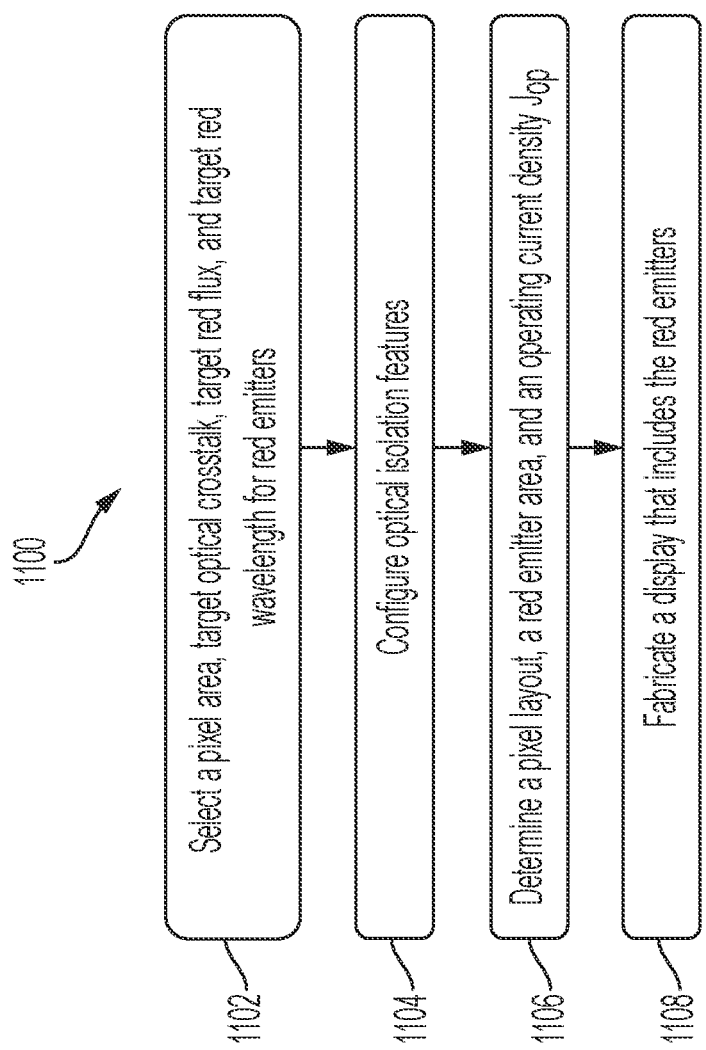
FIG. 11 is a flow chart of a method for designing a display having a trichrome pixel array as shown in FIGS. 8, 9, and 10, according to a possible implementation of the present disclosure.

Such a display design can proceed according to a method 1100 illustrated in FIG. 11, according to a possible implementation of the present disclosure. The method 1100 outlines a series of operations for making a display having a trichrome pixel array 100 that includes specialized red emitters 102. For illustrative purposes, operations illustrated in FIG. 11 will be described with reference to properties of the red emitters 102, as illustrated in FIGS. 12-17. FIGS. 12-17 are plots that describe the behavior of the red emitters 102 when operated at or near an operating current density $J_{op}$, according to some implementations. Operations of method 1100 can be performed in a different order, or not performed, depending on specific applications. It is noted that method 1100 may not produce a complete trichrome pixel array 100. Accordingly, it is understood that additional processes can be provided before, during, or after method 1100, and that some of these additional processes may be briefly described herein. In a possible implementation, the method 1100 includes operations 1102-1106 as described below, with reference to FIGS. 11-17.

At 1102, in a possible implementation, a desired pixel area, maximum optical crosstalk, minimum red wavelength and minimum red flux can be selected for red micro-LED light emitters 102R within a pixel array, e.g., within the trichrome pixel array 100, of a display. In some implementations, the red micro-LED light emitters can include light-emitting layers of indium gallium nitride (InGaN). An electrical current density $J_{op}$, then can be determined such that a red micro-LED operated at $J_{op}$ emits light at a wavelength at least as long as the red wavelength, with at least the red flux. In designing such a display, the parameters of flux and wavelength may further be combined with a constraint on the area of the display, based on a desired choice of pixel pitch 106 or based on the desired pixel area. In some implementations, the pixel area can be selected to be less than or equal to an area of about 5×5 μm².

At 1104, in a possible implementation, optical isolation features can be configured to facilitate a reduced optical crosstalk, such that the crosstalk is less than the maximum optical crosstalk. A maximum optical crosstalk may be expressed as follows: less than 50% (e.g., less than 20%, less than 10%, less than 5%, less than 2%, less than 1%, or less than 0.1%) of an optical power emitted by a pixel propagates laterally to another pixel; at least 20% (e.g., at least 50%, at least 80%, at least 90%, at least 95%, at least 99%, or at least 99.9%) of light emitted by an emitter in a trichrome pixel 104 escapes from the display within the footprint of the trichrome pixel; 104 for a display having a pixel pitch 106 equal to P, at least 20% (e.g. at least 50%, at least 80%, at least 90%, at least 95%, at least 99%, or at least 99.9%) of light emitted by an emitter in the trichrome pixel 104 escapes from the display within a circle of radius P relative to the centroid 215 of the trichrome pixel 104 (e.g., the centroid 215 of the polygon subtending the pixel footprint).

At 1106, a pixel layout including a red micro-LED emitter area can be determined, such that the pixel area is about the desired pixel area, and the pixel layout facilitates the red micro-LED emitting at least the minimum red flux with at least the minimum red wavelength. In addition, at 1104 an operating current of the red InGaN micro-LED light emitters, e.g., the emitters 102R, can be determined, according to a possible implementation of the present disclosure. In some implementations, the pixel area can be specified such that the red sub-pixel has a red emitter area between about 10% and about 90%, or between about 20% and about 80%, or between about 20% and about 50%, of the pixel area. In some implementations, a maximum emitter area can be specified, such that the red sub-pixel has a red emitter area that is less than the maximum emitter area (e.g., less than about 0.5 $\mu m^2$, 1 $\mu m^2$, 2 $\mu m^2$, or 3 $\mu m^2$). In some implementations, the red sub-pixel has an area of at least 15% (e.g., at least 20%, at least 25%, at least 30%, at least 35%, at least 40%, at least 45%, or at least 50%) of the total pixel area. In some implementations, operations 1104 and 1106 can be undertaken jointly so that the optical isolation features and the pixel layout may be jointly configured to facilitate the aforementioned properties. Accordingly, by making use of sufficiently large emitters, or subpixels, some implementations can provide a sufficient flux at a sufficient wavelength, when the InGaN micro-LED light emitters are operated at the determined operating current. The flux from a subpixel may be expressed as an optical current density, defined as an optical current emitted by the device (e.g, by a red subpixel) divided by the area of the device (e.g., the emitter area of the red subpixel). As an example, a red subpixel having an emitter area of about 1×1 $\mu m^2$ and emitting about 10 nW of light at 620 nm emits an optical current density of about 0.5 A/cm².

In some implementations, a red sub-pixel may emit an optical current density of at least about 0.1 Amps/cm² (e.g., about 0.2 Amps/cm², 0.5 Amps/cm², 1 Amps/cm², 2 Amps/cm², 5 Amps/cm², or 10 Amps/cm²) with an external quantum efficiency of at least 2% (e.g., at least at least 3%, at least 4%, at least 5%, at least 7.5%, at least 10%, at least 12.5%, at least 15%, at least 20%, or at least 25%). In some implementations, the red sub-pixel may emit light with a peak wavelength of at least 590 nm (e.g., 600 nm, 610 nm, 620 nm, 630 nm, 640 nm, or 650 nm), or with a dominant wavelength of at least 590 nm (e.g., 600 nm, 610 nm, 620 nm, 630 nm, 640 nm, or 650 nm). A sufficiently long red wavelength may facilitate a display with a sufficient color gamut, e.g. at least sRGB, or at least DCI-P3.

A sensitivity of wavelength and/or efficiency to electrical current density may be affected by the epitaxial structure of the III-nitride layer e.g., by a composition or a thickness of the quantum well and barrier layers surrounding it.

At 1108, a display can be fabricated that includes a plurality of the red InGaN micro-LED emitters 102R, according to an implementation of the present disclosure. Fabrication of the display can use established semiconductor processing techniques, wherein the display design specifies a pixel array layout that can be realized as a photolithography mask. The mask is created according to a pixel array layout, e.g., the trichrome pixel array 100, that includes the selected pixel area and red emitter area dimensions. The mask can then be used to pattern the micro-LED emitters 102R in a layer of InGaN on the substrate 902, as shown in FIG. 9. In some implementations, the emitters 102R can be spaced apart by a selected pixel pitch 106. Once the display is fabricated with the properly sized red InGaN micro-LED emitters, the display can be operated at the determined operating current.

Figure 12:
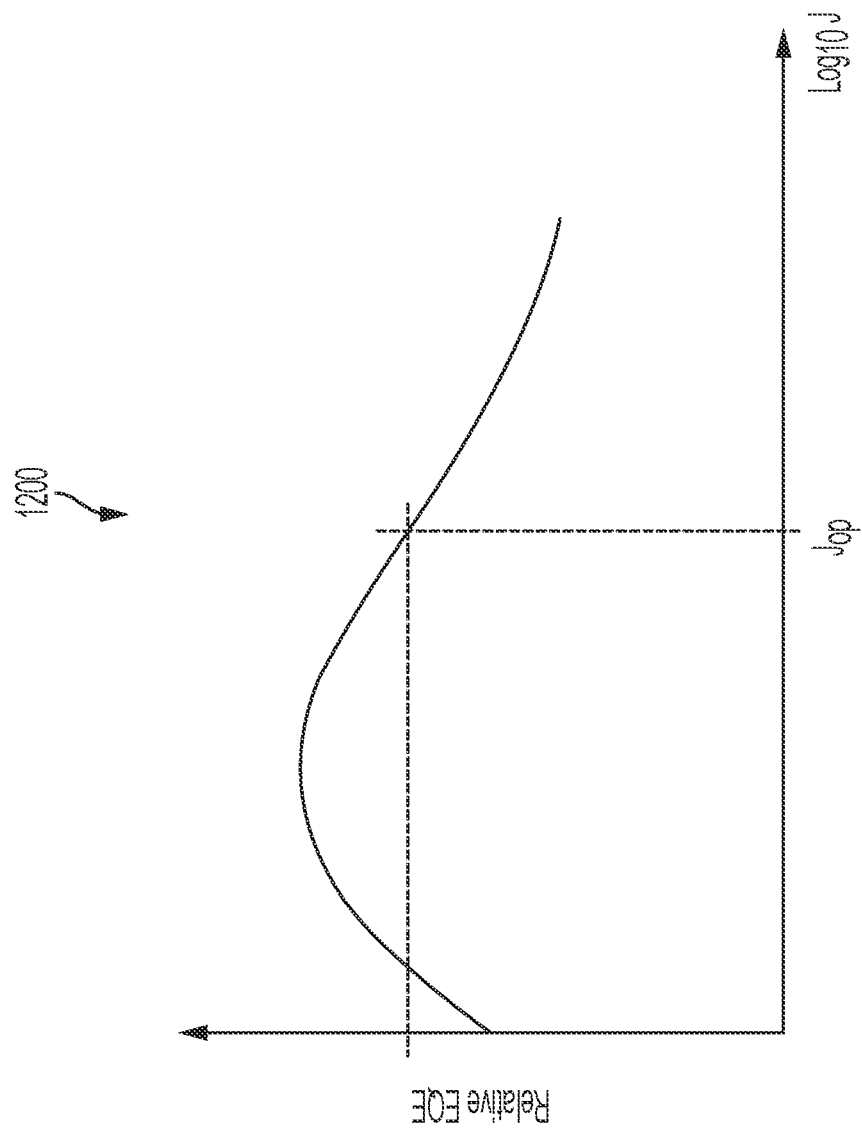
FIGS. 12-17 are plots illustrating the behavior of III-nitride red micro-LEDs when operated over a range of current densities, according to a possible implementation of the present disclosure.

FIG. 12 shows a plot 1200 of relative external quantum efficiency (EQE) as a function of the base 10 logarithm of the red electrical current density J, according to some implementations of the current disclosure. FIG. 12 shows a relative EQE calculated for a III-nitride red micro-LED when it is operated various current densities. Near the operational current density $J_{op}$, the EQE has a negative slope, such that an increase in current density causes a decrease in EQE.

Figure 13:
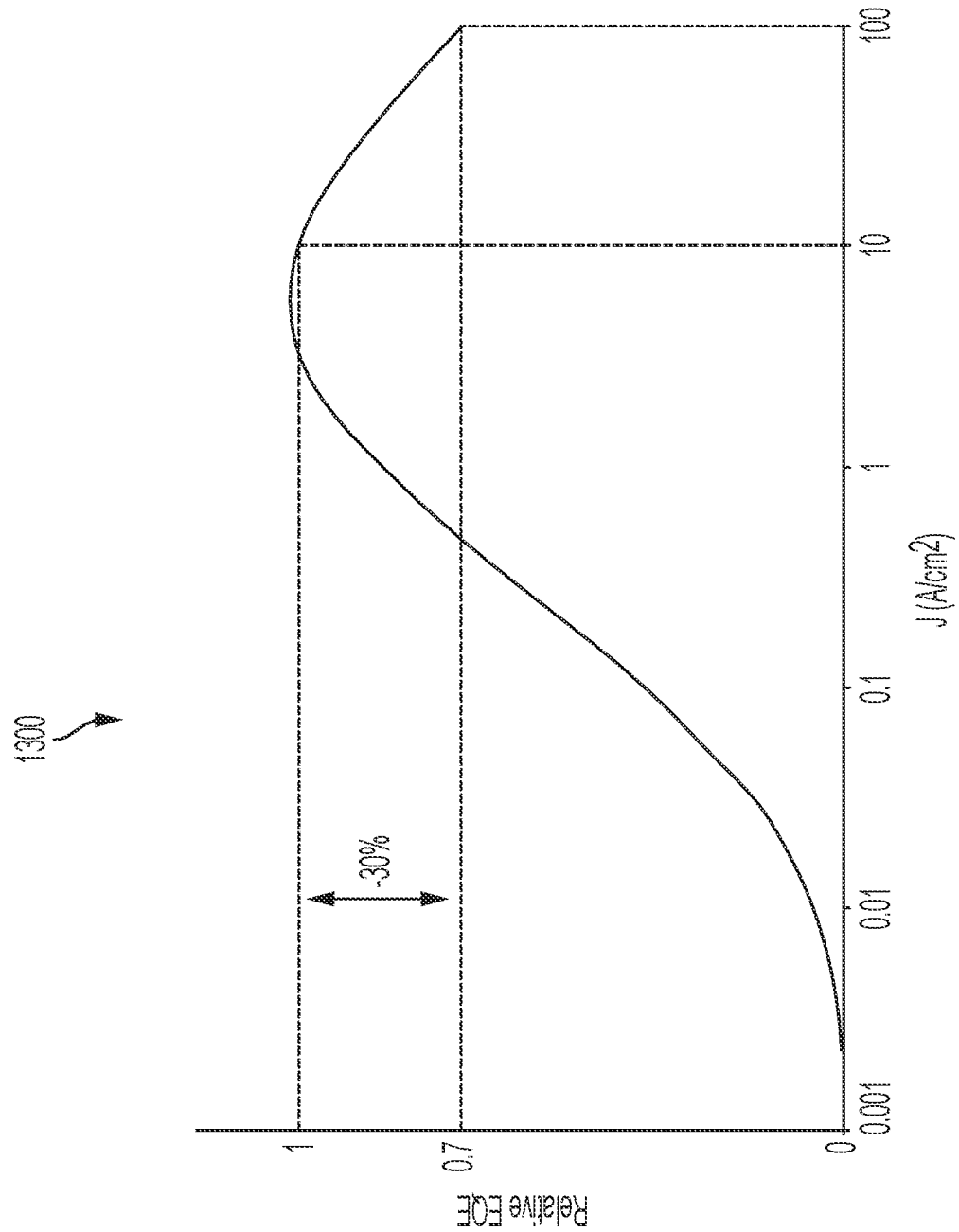

FIG. 13 shows a plot 1300 of experimentally measured relative EQE data for a red III-nitride LED, having a behavior similar to that shown in FIG. 12. For an operational current density $J_{op}$=10 A/cm², an increase in current density by about 10×, to 100 A/cm² is associated with a relative EQE drop of about 30%.

Figure 14:
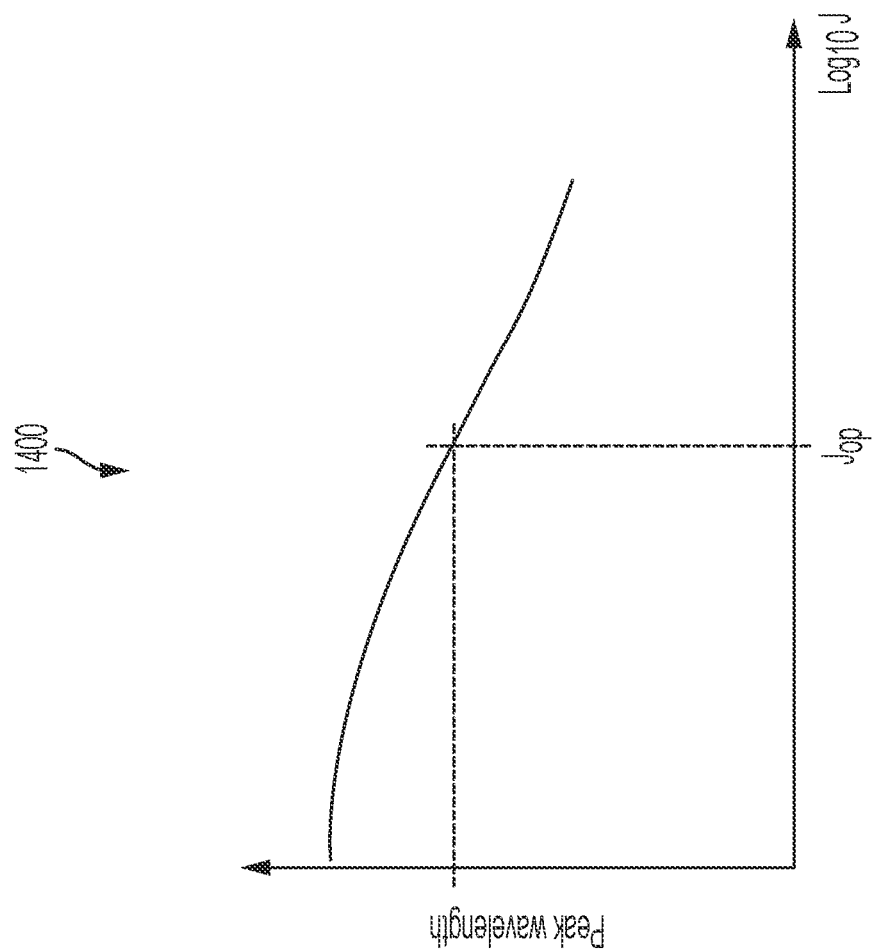

FIG. 14 shows a plot 1400 of peak wavelength of a III-nitride red micro-LED as a function of electrical current density J, according to some implementations of the current disclosure. FIG. 14 shows that when the III-nitride red micro-LED is operated near $J_{op}$, the wavelength has a negative slope, such that an increase in current density causes a wavelength shift to a shorter wavelength. This results in a color change of the pixel, due to a color change in the light being emitted by the red micro-LED.

Figure 15:
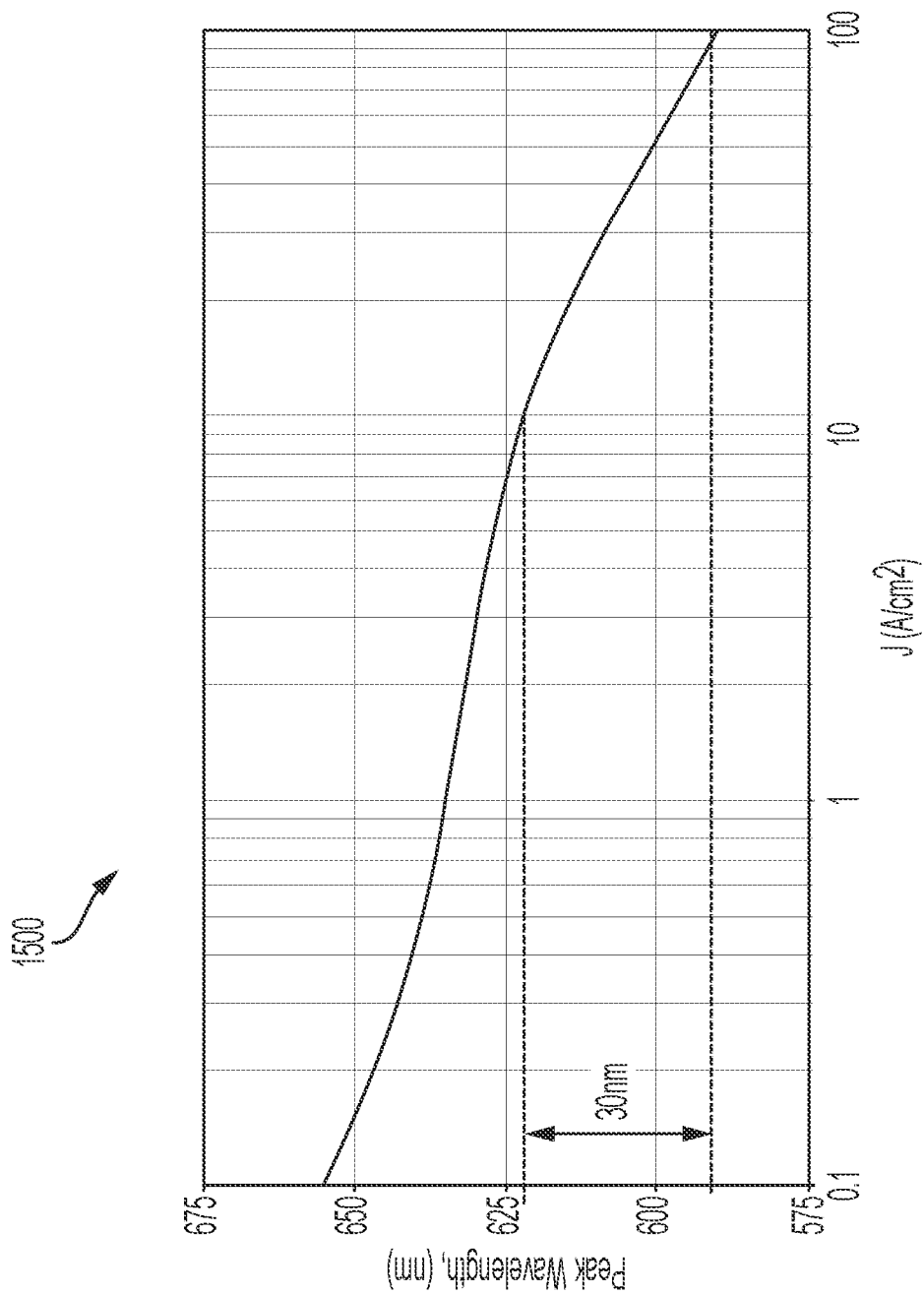

FIG. 15 shows a plot 1500 of experimentally measured peak wavelength data for a red III-nitride LED, having a behavior similar to that of FIG. 14. For an operational current density $J_{op}$=10 A/cm², an increase in current density by about 10×, to 100 A/cm² is associated with a wavelength shift of about 30 nm.

It may be desirable to operate the red micro-LED at a sufficiently high EQE, and with a sufficiently long wavelength. Therefore, for a given operating electric current applied to the red micro-LED, it may be desirable to increase the area of the red micro-LED so as to decrease the electrical current density $J_{op}$.

Accordingly, some implementations provide trichrome pixel layouts in which the trichrome pixels have large red emitters. In contrast to displays in which the emitters within a pixel may have similar areas, some implementations of the present disclosure have red emitters whose emitter area is significantly greater (e.g., at least about 1.5 times, 1.75 times, 2 times, 2.25 times, 2.5 times, or 3 times) than the areas of the blue and green emitters. Some implementations have a red "filling factor," or fraction of the pixel's total area covered by the red emitter) that is at least in the range of about 15% to about 50% (e.g., about 20%, 25%, 30%, 35%, 40%, 45%, or 50%).

Table I shows 15 examples of pixel geometries, with dimensions and filling factors for each micro-LED color. The pitch, radius, and area dimensions in Table 1 are in um 'ff' indicates the filling factor. Under 'Area ratio,' R/B is a ratio of the red emitter area to the blue emitter area, and R/G is a ratio of the red emitter area to the green emitter area. While the values listed in Table 1 pertain to circular emitters for simplicity, similar values can be achieved with hexagonal pixels, polygonal pixels, irregular polygonal pixels, and pixels of arbitrary shape.

TABLE I

Table I: Emitter dimensions for different pixel pitches

| | | Blue | | | Green | | | Red | | | Area ratio | |
|---|---|---|---|---|---|---|---|---|---|---|---|---|
| Example | Pitch | Radius | Area | ff | Radius | Area | ff | Radius | Area | ff | R/B | R/G |
| 1 | 4 | 0.5 | 0.785 | 5% | 0.5 | 0.785 | 5% | 1 | 3.142 | 20% | 4 | 4 |
| 2 | 4 | 0.5 | 0.785 | 5% | 0.5 | 0.785 | 5% | 1.5 | 7.069 | 44% | 9 | 9 |
| 3 | 4 | 0.75 | 1.767 | 11% | 0.75 | 1.767 | 11% | 1 | 3.142 | 20% | 1.8 | 1.8 |
| 4 | 4 | 0.5 | 0.785 | 5% | 0.75 | 1.767 | 11% | 1 | 3.142 | 20% | 4 | 1.8 |
| 5 | 4 | 0.75 | 1.767 | 11% | 0.5 | 0.785 | 5% | 1 | 3.142 | 20% | 1.8 | 4 |
| 6 | 3 | 0.38 | 0.442 | 5% | 0.38 | 0.442 | 5% | 0.75 | 1.767 | 20% | 4 | 4 |
| 7 | 3 | 0.38 | 0.442 | 5% | 0.38 | 0.442 | 5% | 1.13 | 3.976 | 44% | 9 | 9 |
| 8 | 3 | 0.56 | 0.994 | 11% | 0.56 | 0.994 | 11% | 0.75 | 1.767 | 20% | 1.8 | 1.8 |
| 9 | 3 | 0.38 | 0.442 | 5% | 0.56 | 0.994 | 11% | 0.75 | 1.767 | 20% | 4 | 1.8 |
| 10 | 3 | 0.56 | 0.994 | 11% | 0.38 | 0.442 | 5% | 0.75 | 1.767 | 20% | 1.8 | 4 |
| 11 | 2 | 0.25 | 0.196 | 5% | 0.25 | 0.196 | 5% | 0.50 | 0.785 | 20% | 4 | 4 |
| 12 | 2 | 0.25 | 0.196 | 5% | 0.25 | 0.196 | 5% | 0.75 | 1.767 | 44% | 9 | 9 |
| 13 | 2 | 0.38 | 0.442 | 11% | 0.38 | 0.442 | 11% | 0.50 | 0.785 | 20% | 1.8 | 1.8 |
| 14 | 2 | 0.25 | 0.196 | 5% | 0.38 | 0.442 | 11% | 0.50 | 0.785 | 20% | 4 | 1.8 |
| 15 | 2 | 0.38 | 0.442 | 11% | 0.25 | 0.196 | 5% | 0.50 | 0.785 | 20% | 1.8 | 4 |

Figure 16:
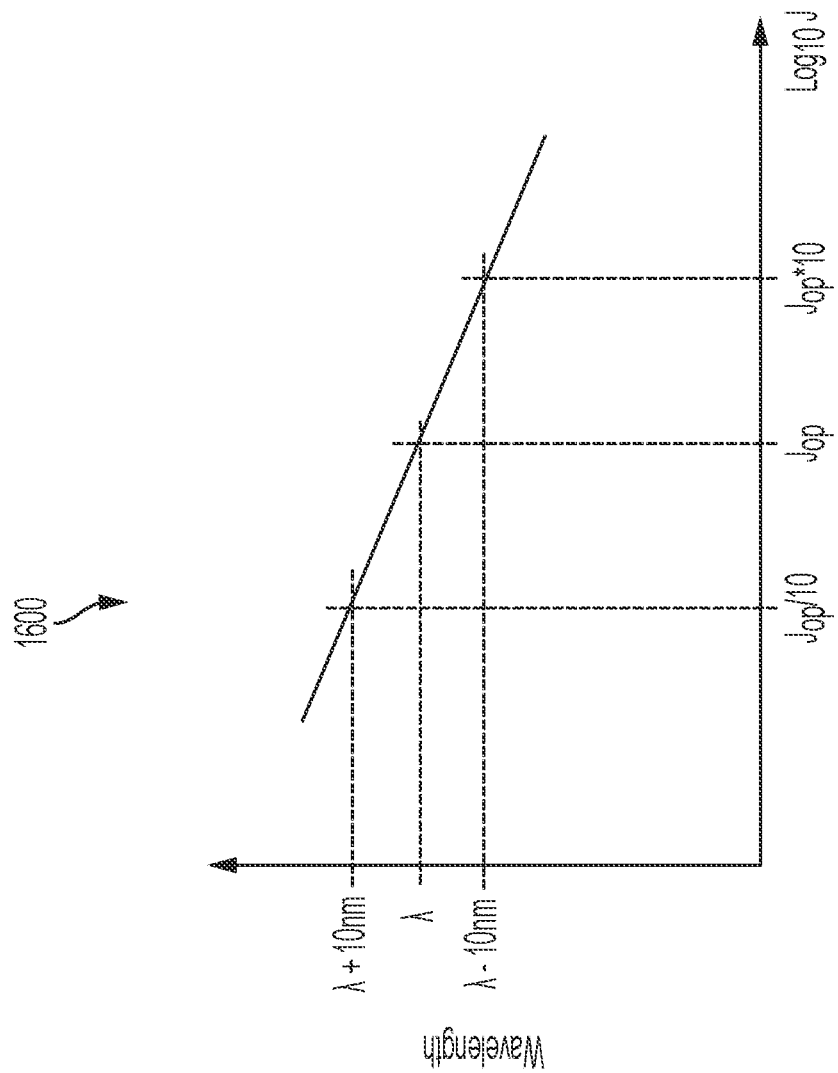

FIG. 16 illustrates a device that has a wavelength sensitivity to current density, according to some implementations of the current disclosure. In a plot 1600, the wavelength is shown as a function of the electrical current density J on a $\log_{10}$ scale. The wavelength is approximately linear as a function of the log of the current density. Around the operating current density $J_{op}$, an increase in J by 10× is associated with a wavelength decrease by 10 nm. Some implementations are characterized by a combination of a large sensitivity to electrical current density, and a large red emitter area. Sensitivity to current density may refer to the wavelength, the IQE, or the EQE of the device. The sensitivity may characterize the device when operated at a particular current density, for instance the operation current density $J_{op}$. In some implementations, a device has a wavelength sensitivity to electrical current density of at least 10 nm per decade (e.g., 10 nm, 15 nm, 20 nm, 25 nm, or 30 nm per decade). Thus, when the current density is increased by 10× from the operating current density $J_{op}$, the wavelength shifts by at least 10 nm (e.g., 15 nm, 20 nm, 25 nm, or 30 nm).

Figure 17:
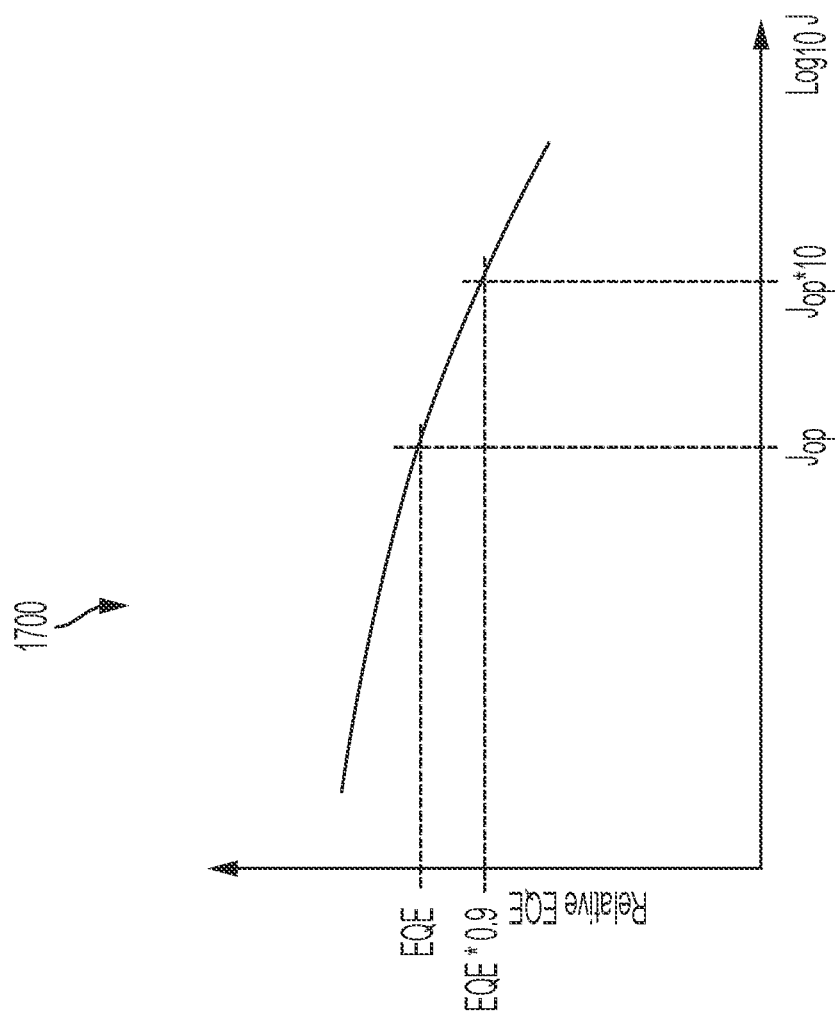

FIG. 17 illustrates a device having an EQE wavelength sensitivity to electrical current density, according to some implementations of the current disclosure. In a plot 1700, the relative EQE (in arbitrary units) is shown as a function of the electrical current density $J_{op}$ on a $\log_{10}$ scale. Around the operating current density $J_{op}$, an increase in J by a factor of 10× is associated with a 10% decrease in the the EQE In some implementations, a device has a relative EQE sensitivity, or a relative IQE sensitivity, to electrical current density of at least 10% per decade (e.g., about 10%, 15%, 20%, 25%, or 30% per decade). Thus, when the current density is increased by 10× from the operating current density $J_{op}$, the EQE drops by at least 10% (e.g., by about 10%, 15%, 20%, 25%, or 30%).

While the current sensitivities of FIGS. 16 and 17 are shown as variations of a curve across a decade, the local slope of the curve at the operating point (the derivative of the curve at $J_{op}$) can be considered instead—this is a broader definition if the curve is not linear across a decade of electrical current density.

The methods 300 and 1100 can be automated, or partially automated, and thus performed as computer-implemented methods, with the use of a computer system 1800, which is illustrated in FIG. 18. That is, the operations 302-310 and/or 1102-1108 can be encoded in a computer program, e.g., an application 1812, that can be executed by one or more processors 1852, e.g., microprocessors, within the computer system 1800.

The system 1800 includes a computing system 1802. The computing system 1802 The computing system 1802 may also be referred to as a client computing device or a client device. The computing system 1802 is a device having an operating system 1810. In some examples, the computing system 1802 includes a personal computer, a mobile phone, a tablet, a netbook, a laptop, a smart appliance (e.g., a smart television), or a wearable device. The computing system 1802 can be any computing device with input devices(s) 1830, such as a mouse, trackpad, touchscreen, keyboard, virtual keyboard, camera, etc. The computing system 1802 can include output device(s) 1824, such as a display (monitor, touchscreen, headset, heads-up display, etc.) that enables a user to view and select displayed content. The computing system 1802 may include one or more processors, such as CPU/GPU 1832, formed in a substrate configured to execute one or more machine executable instructions or pieces of software, firmware, or a combination thereof. One or more of the processors, such as CPU/GPU 1832, can be semiconductor-based microprocessors, that is, the processors can include semiconductor material that can perform digital logic. The computing system 1802 may include one or more memory devices 1804. The memory devices 1804 may include a main memory that stores information in a format that can be read and/or executed by the CPU/GPU 1832. The memory devices 1804 may store applications or modules (e.g., operating system 1810, applications 1812, pixel grid generator application 1818, etc.) that, when executed by the CPU/GPU 1832, perform certain operations.

The operating system 1810 is a system software that manages computer hardware, software resources, and provides common services for computing programs. In some examples, the operating system 1810 is operable to run on a personal computer such as a laptop, netbook, or a desktop computer. In some examples, the operating system 1810 is operable to run on a mobile computer such as a smartphone, a tablet, a watch, a headset, or other wearable computing device. The operating system 1810 may include a plurality of modules configured to provide the common services and manage the resources of the computing system 1802. The computing system 1802 may include one or more input devices 1830 that enable a user to select content. Non-exclusive example input devices 1830 include a keyboard, a mouse, a touch-sensitive display, a trackpad, a trackball, a biometric sensor, an eye movement tracking device, and the like. The computing system 1802 may include one or more output devices 1824 that enable a user to view a webpage and/or receive audio or other visual output.

The computing system 1802 may include applications 1812, which represent specially programmed software configured to perform different functions. One of the applications may be a pixel grid generator application 1818. The pixel grid generator application 1818 may be configured to generate and/or transform pixel grid information in accordance with operations of the method 300 and/or in accordance with operations of the method 1100.

In some examples, the computing system 1802 may communicate with a server computing system 1850 over a network 1840. The server computing system 1850 may be a computing device or computing devices that take the form of a number of different devices, for example a standard server, a group of such servers, or a rack server system. In some examples, the server computing system 1850 may be a single system sharing components such as processors and memories. The network 1840 may include the Internet and/or other types of data networks, such as a local area network (LAN), a wide area network (WAN), a cellular network, satellite network, or other types of data networks. The network 1840 may also include any number of computing devices (e.g., computer, servers, routers, network switches, etc.) that are configured to receive and/or transmit data within network 1840. Network 1840 may further include any number of hardwired and/or wireless connections.

The server computing system 1850 may include one or more processors 1852 formed in a substrate, an operating system (not shown) and one or more memory devices 1854. The memory devices 1854 may represent any kind of (or multiple kinds of) memory (e.g., RAM, flash, cache, disk, tape, etc.). In some examples (not shown), the memory devices 1854 may include external storage, e.g., memory physically remote from but accessible by the server computing system 1850. The server computing system 1850 may include one or more modules or engines representing specially programmed software. For example, the server computing system 1850 may include systems for managing and accessing user account(s) 1860. The user accounts 1860 may include data that a user has requested to be synchronized across devices, such as computing system 1802. The synchronized data can include session data 1862. The session data 1862 can enable a user to resume browsing activity after switching devices. The user account 1860 may also include profile data 1864. The profile data 1864 may include, with user consent, information describing the user. The profile data 1864 may also include data that identifies a user (e.g., a username and password). The user account 1860 may also include synchronized saved location storage 1866. The saved location storage 1866 may be a data store of saved locations for the user across devices. For example, as part of a synchronization activity the local saved location storage 1826 may be sent from the computing system 1802 to the server computing system 1850 and saved in saved location storage 1866.

The preceding disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact and may also include embodiments in which additional features may be formed that are between the first and second features, such that the first and second features are not in direct contact.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used in this specification, a singular form may, unless definitely indicating a particular case in terms of the context, include a plural form. Spatially relative terms (e.g., "over," "above," "upper," "under," "beneath," "below," "lower," and so forth) may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In some implementations, the relative terms above and below can, respectively, include vertically above and vertically below. In some implementations, the term "adjacent" can include laterally adjacent to or horizontally adjacent to.

In some implementations of the present disclosure, the terms "about" and "substantially" can indicate a value of a given quantity that varies within 20% of the value (for example, ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

Some implementations may be executed using various semiconductor processing and/or packaging techniques. Some implementations may be executed using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

It is to be appreciated that the Detailed Description section, and not the Abstract section, is intended to be used to interpret the claims. The Abstract section may set forth one or more but not all possible embodiments of the present disclosure as contemplated by the inventor(s), and thus, are not intended to limit the subjoined claims in any way.

The invention claimed is:

1. A method, comprising:
    selecting a pixel area, a red flux, and a red wavelength for red indium gallium nitride (InGaN) micro-LED light emitters within a pixel array of a display;
    determining a red emitter area and an operating current density of the red InGaN micro-LED light emitters, such that when the red InGaN micro-LED light emitters are operated at the operating current density, light is emitted at least at the red flux with a wavelength of at least the red wavelength, the red emitter area being between 10% and 90% of the pixel area; and
    fabricating a display that includes a plurality of the red InGaN micro-LED light emitters.

2. The method of claim 1, wherein the red wavelength is at least 600 nm.

3. The method of claim 1, wherein the pixel area is less than 5×5 µm$^2$.

4. The method of claim 1, wherein a ratio of the red flux to the pixel area is at least 0.1 Amp/cm$^2$.

5. The method of claim 1, further comprising forming the red InGaN micro-LED light emitters on a III-nitride semiconductor substrate that includes at least one InGaN-containing quantum well.

6. A method, comprising:
    forming a III-nitride layer on a substrate;
    forming a layout of trichrome pixels in the III-nitride layer, each trichrome pixel having a pixel area and including three monochrome micro-LED emitters having different emitter areas; and
    forming a metal contact disposed on a corresponding one of three monochrome micro-LED emitters, the metal contact having a contact area, wherein a ratio of the contact area to the emitter area of the corresponding one of the three monochrome micro-LED emitters is based on a color of the corresponding one of the three monochrome micro-LED emitters.

7. The method of claim 6, further comprising, within the III-nitride layer, pixel isolation regions defining a pixel separation distance between adjacent pixels.

8. The method of claim 7, wherein the pixel separation distance is greater than an emitter separation distance d between adjacent micro-LED emitters.

9. The method of claim 6, wherein a total area occupied by the three monochrome micro-LED emitters in each trichrome pixel is at least 55% of the pixel area.

10. The method of claim 6, wherein a pixel pitch of the trichrome pixels is less than or equal to 4.0 µm.

11. A method, comprising:
    selecting a target optical crosstalk for micro-LED light emitters within a pixel array of a display;
    determining an optical isolation configuration and a pixel layout of the micro-LED light emitters, such that the optical isolation configuration facilitates an optical crosstalk from a first pixel to a second pixel of the pixel array that is less that of the target optical crosstalk; and
    fabricating a display that includes the optical isolation configuration and a plurality of the micro-LED light emitters.

12. The method of claim 11, wherein the pixel array includes a plurality of red indium gallium nitride (InGaN) micro-light emitting diodes (micro-LEDs), the red InGaN micro-LEDs having a red flux, a red wavelength, and a red emitter area between 10% and 90% of a target pixel area,
    the display is configured to operate such that the pixel array emits red light at least at the red flux with a wavelength of at least the red wavelength.

13. The method of claim 12, wherein the pixel array includes a plurality of green InGaN micro-LEDs and a plurality of blue InGaN micro-LEDs,
    the red InGaN micro-LEDs, the green InGaN micro-LEDs, and the blue InGaN micro-LEDs are formed monolithically on a III-nitride substrate.

14. The method of claim 12, wherein the red InGaN micro-LEDs have a wavelength shift of at least 10 nm per current decade relative to an operating current density.

15. The method of claim 12, wherein the red InGaN micro-LEDs have a relative external quantum efficiency (EQE) variation of at least 10% per current decade relative to an operating current density.

16. A method, comprising:
    transforming a grid of regular hexagonal light emitters, having sides of equal lengths and equal angles between the sides, into a square grid of pixels having a set of at least four pixels within a boundary having a length dimension equal to a width dimension; and
    transforming the square grid of pixels into a square rectilinear grid of pixels, each of the pixels from the square rectilinear grid of pixels including a first irregular hexagonal light emitter, a second irregular hexagonal light emitter, and a third irregular hexagonal light emitter, the square rectilinear grid of pixels including:
    a first pixel adjacent to a second pixel, the first pixel having a centroid aligned with a centroid of the second pixel along a first direction, and
    a third pixel adjacent to the second pixel, the third pixel having a centroid aligned with the centroid of the second pixel along a second direction orthogonal to the first direction.

17. The method of claim 16, wherein each of the regular hexagonal light emitters and irregular hexagonal light emitters has six sides, three median lines that bisect opposite sides of the six sides, and an emitter center point located at an intersection of the three median lines.

18. The method of claim 17, wherein a centroid of each of the square rectilinear grid of pixels is located at a spatial average of respective emitter center points of the first irregular hexagonal light emitter, the second irregular hexagonal light emitter, and the third irregular hexagonal light emitter of each of the square rectilinear grid of pixels.

19. The method of claim 18, wherein the centroid of each of the square rectilinear grid of pixels does not intersect with a side of any of the first irregular hexagonal light emitter, the second irregular hexagonal light emitter, or the third irregular hexagonal light emitter of each of the square rectilinear grid of pixels.

20. The method of claim 16, wherein the first irregular hexagonal light emitter is a red emitter, the second irregular hexagonal light emitter is a green emitter, and the third irregular hexagonal light emitter is a blue emitter,
the method further comprising forming a trichrome emitter of a composite color by adjusting relative emitter areas of the red emitter, the green emitter, and the blue emitter.

21. The method of claim 20, wherein adjusting the relative emitter areas includes adjusting lengths of the sides of the first irregular hexagonal light emitter, the second irregular hexagonal light emitter, and the third irregular hexagonal light emitter to expand or contract corresponding emitter areas.

22. The method of claim 20, wherein adjusting the relative emitter areas includes expanding an area of the red emitter and contracting areas of the green emitter and the blue emitter.

23. The method of claim 16, wherein:
each pixel within the square grid of pixels includes three laterally expanded hexagonal light emitters, each having an emitter width greater than an emitter height, and
at least two of the emitter widths within each pixel are different.

24. The method of claim 16, further comprising:
forming isolated pixels within the square rectilinear grid of pixels; and
forming a separation between the isolated pixels, at a selected separation distance.

* * * * *

UNITED STATES PATENT AND TRADEMARK OFFICE
CERTIFICATE OF CORRECTION

PATENT NO. : 12,369,436 B2
APPLICATION NO. : 18/166324
DATED : July 22, 2025
INVENTOR(S) : He et al.

Page 1 of 1

It is certified that error appears in the above-identified patent and that said Letters Patent is hereby corrected as shown below:

In the Claims

In Column 24, Claim 11, Line 22, delete "less" and insert -- less than --, therefor.

Signed and Sealed this
Twenty-eighth Day of October, 2025

John A. Squires
*Director of the United States Patent and Trademark Office*